United States Patent
Machida

(10) Patent No.: US 11,808,521 B2
(45) Date of Patent: Nov. 7, 2023

(54) LOOP HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/193,117

(22) Filed: Mar. 5, 2021

(65) Prior Publication Data

US 2021/0293487 A1  Sep. 23, 2021

(30) Foreign Application Priority Data

Mar. 17, 2020 (JP) ................. 2020-046252

(51) Int. Cl.
*F28D 15/04* (2006.01)

(52) U.S. Cl.
CPC .................. *F28D 15/043* (2013.01)

(58) Field of Classification Search
CPC ................ F28D 15/0266; F28D 15/043
See application file for complete search history.

(56) References Cited

U.S. PATENT DOCUMENTS

| | | | | |
|---|---|---|---|---|
| 6,729,383 B1 * | 5/2004 | Cannell | | H01L 23/473 |
| | | | | 257/E23.098 |
| 10,704,838 B2 | 7/2020 | Machida et al. | | |
| 2005/0022978 A1 * | 2/2005 | Duval | | H01L 23/427 |
| | | | | 257/E23.088 |
| 2014/0174700 A1 * | 6/2014 | Lin | | F28D 15/046 |
| | | | | 29/521 |
| 2016/0259383 A1 * | 9/2016 | Shioga | | F28D 15/0266 |
| 2018/0058767 A1 * | 3/2018 | Machida | | H01L 21/4882 |
| 2018/0142960 A1 * | 5/2018 | Kurashima | | F28F 3/08 |

(Continued)

FOREIGN PATENT DOCUMENTS

| | | |
|---|---|---|
| CN | 108278916 | 7/2018 |
| EP | 3521743 | 8/2019 |

(Continued)

OTHER PUBLICATIONS

JP-6400240 EPO English Translation, Machida (Year: 2018).*

(Continued)

*Primary Examiner* — Travis Ruby
*Assistant Examiner* — Christopher C Pillow
(74) *Attorney, Agent, or Firm* — IPUSA, PLLC

(57) ABSTRACT

A loop heat pipe includes two outermost metal layers, an intermediate metal layer provided between the outermost metal layers, an evaporator, a condenser, and liquid and vapor pipes connecting the evaporator and the condenser and forming a loop shaped passage. The intermediate metal layer includes a pair of walls forming a part of a pipe wall of the evaporator, the condenser, the liquid pipe, and the vapor pipe, a porous body provided between the pair of walls, and a strut penetrating the porous body and bonding the outermost metal layers, and one or more metal layers. Each of the one or more metal layers includes a first part forming a part of the pair of walls, a second part connected to the first part and forming a part of the porous body, and a third part connected to the second part and forming a part of the strut.

16 Claims, 19 Drawing Sheets

(56) References Cited

U.S. PATENT DOCUMENTS

| | | | |
|---|---|---|---|
| 2018/0164043 A1* | 6/2018 | Kurashima | ........... F28D 15/046 |
| 2019/0090385 A1 | 3/2019 | Machida et al. | |
| 2019/0227607 A1 | 7/2019 | Machida | |
| 2019/0242652 A1 | 8/2019 | Machida | |
| 2020/0018556 A1 | 1/2020 | Machida | |
| 2020/0049417 A1 | 2/2020 | Machida | |
| 2020/0049419 A1 | 2/2020 | Machida | |

FOREIGN PATENT DOCUMENTS

| | | | | |
|---|---|---|---|---|
| EP | 3575727 | | 12/2019 | |
| JP | H11-183067 | | 7/1999 | |
| JP | 6233125 | | 11/2017 | |
| JP | 2018-036012 | | 3/2018 | |
| JP | 6400240 B1 * | | 10/2018 | ................ C23F 1/02 |
| JP | 2019-135434 | | 8/2019 | |
| JP | 2020-008249 | | 1/2020 | |
| JP | 2020-026931 | | 2/2020 | |
| WO | 2015/087451 | | 6/2015 | |

OTHER PUBLICATIONS

Extended European Search Report dated Aug. 5, 2021 with respect to the corresponding European Patent Application No. 21161145.4.
Office Action dated May 30, 2023 with respect to the corresponding Japanese patent application No. 2020-046252.

* cited by examiner

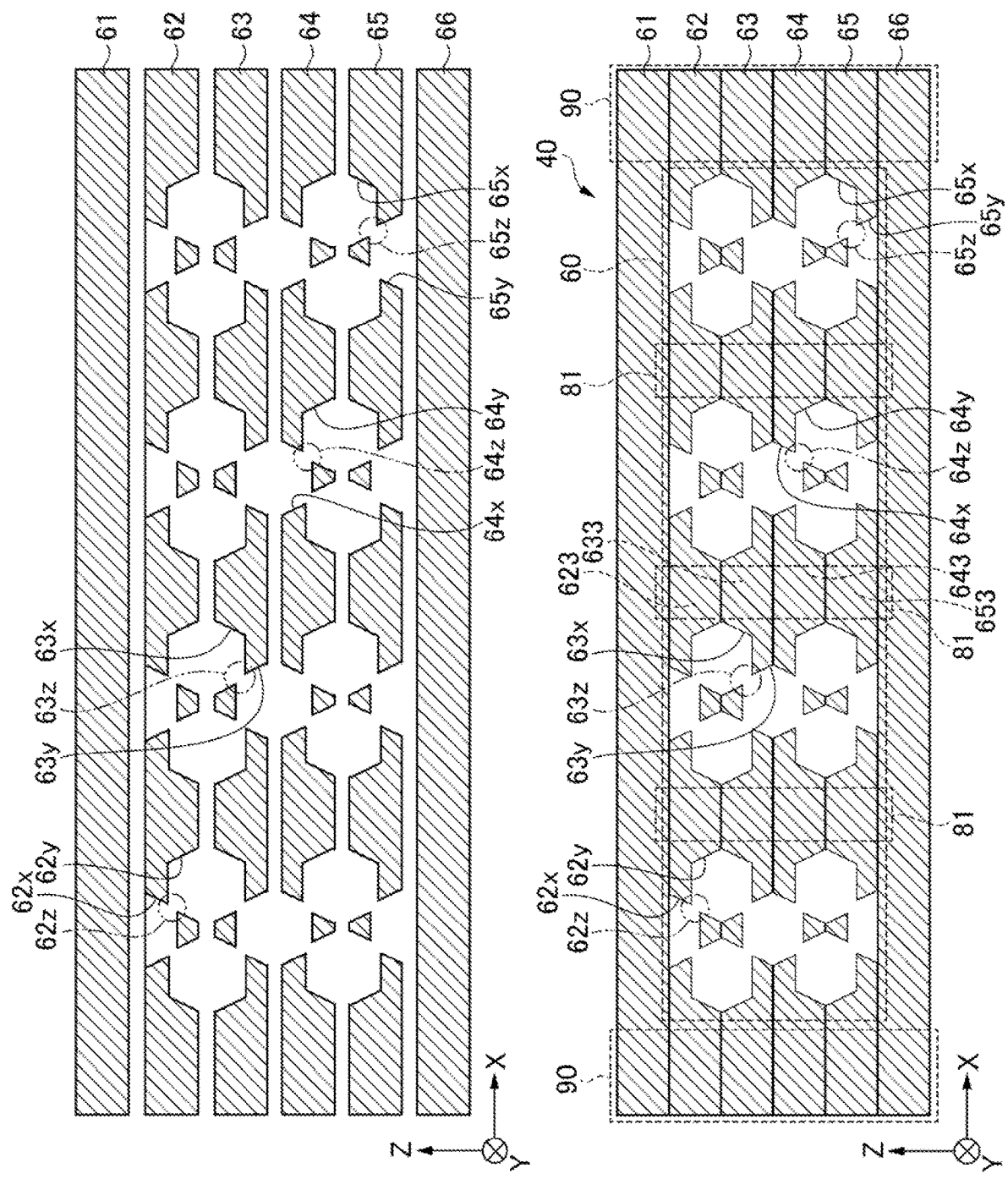

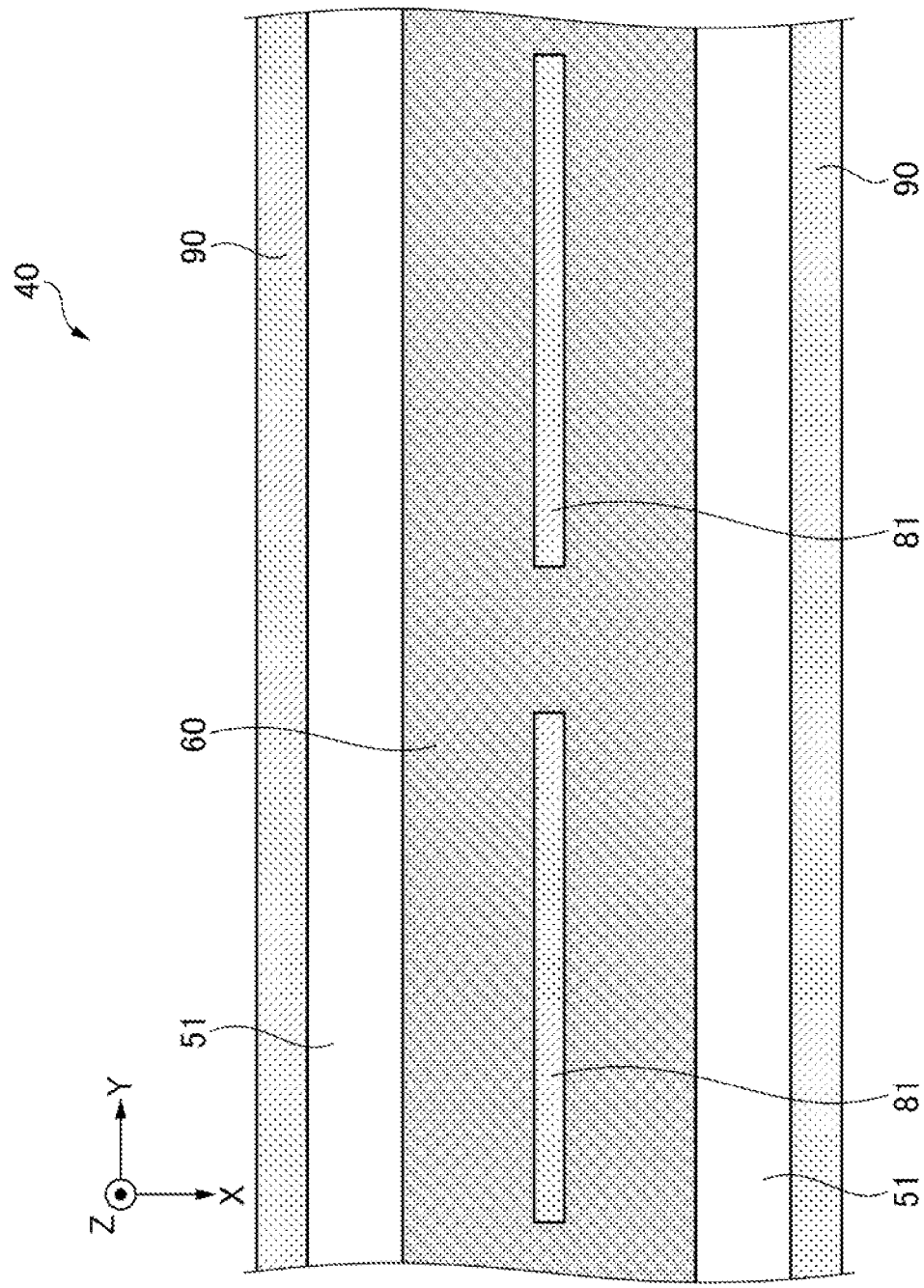

LOOP HEAT PIPE

CROSS-REFERENCE TO RELATED APPLICATION

This application is based upon and claims priority to Japanese Patent Application No. 2020-046252, filed on Mar. 17, 2020, the entire contents of which are incorporated herein by reference.

FIELD

Certain aspects of the embodiments discussed herein are related to loop heat pipes, and methods for manufacturing the loop heat pipe.

BACKGROUND

The heat pipe is known as a device for cooling a heat-generating component, such as a Central Processing Unit (CPU) or the like, provided in electronic devices. The heat pipe utilizes a phase change of a working fluid to transfer heat.

A loop heat pipe is an example of the heat pipe, and includes an evaporator that vaporizes the working fluid by the heat of the heat-generating component, and a condenser that liquefies the vaporized working fluid. The evaporator and the condenser are connected by a loop shaped passage that is formed by a liquid pipe and a vapor pipe. In the loop heat pipe, the working fluid flows through the loop shaped passage in one direction.

In addition, a porous body is provided inside the evaporator and the liquid pipe of the loop heat pipe, and the working fluid inside the liquid pipe is guided to the evaporator due to a capillary force generated in the porous body, to restrict the backflow of vapor from the evaporator to the liquid pipe. A large number of pores are formed in the porous body. Each pore is formed by partially communicating a bottomed hole formed in one side of a metal layer, and a bottomed hole formed in the other side of the metal layer, as described in Japanese Laid-Open Patent Publications No. 2018-036012 and No. 2019-135434 (now Japanese Patents No. 6291000 and No. 6400240, respectively), for example.

Other heat pipes are described in Japanese Laid-Open Patent Publication No. H11-183067, for example.

However, the conventional loop heat pipes may become deformed due to variations in the volume of the working fluid caused by temperature changes.

SUMMARY

Accordingly, it is an object in one aspect of the embodiments to provide a loop heat pipe, and a method for manufacturing the loop heat pipe, which can reduce the deformation of the loop heat pipe due to variations in the volume of the working fluid.

According to one aspect of the embodiments, a loop heat pipe includes a pair of outermost metal layers; an intermediate metal layer provided between the pair of outermost metal layers; an evaporator configured to vaporize a working fluid to generate vapor; a condenser configured to liquefy the vapor of the working fluid; a liquid pipe connecting the evaporator and the condenser; and a vapor pipe connecting the evaporator and the condenser, and forming a loop shaped passage together with the liquid pipe, wherein the intermediate metal layer includes a pair of walls forming a part of a pipe wall of the evaporator, the condenser, the liquid pipe, and the vapor pipe, a porous body provided between the pair of walls, a first strut penetrating the porous body and bonding the pair of outermost metal layers to each other, and one or a plurality of metal layers, wherein each of the one or plurality of metal layers of the intermediate metal layer includes a first part forming at least a part of the pair of walls, a second part connected to the first part, and forming at least a part of the porous body, and a third part connected to the second part, and forming at least a part of the first strut.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 12A and FIG. 12B are diagrams (part 2) illustrating examples of steps for manufacturing the loop heat pipe according to the first embodiment.

FIG. 19 is a plan view illustrating an example of the liquid pipe of the loop heat pipe according to a modification of the second embodiment.

DESCRIPTION OF EMBODIMENTS

Figure 1:
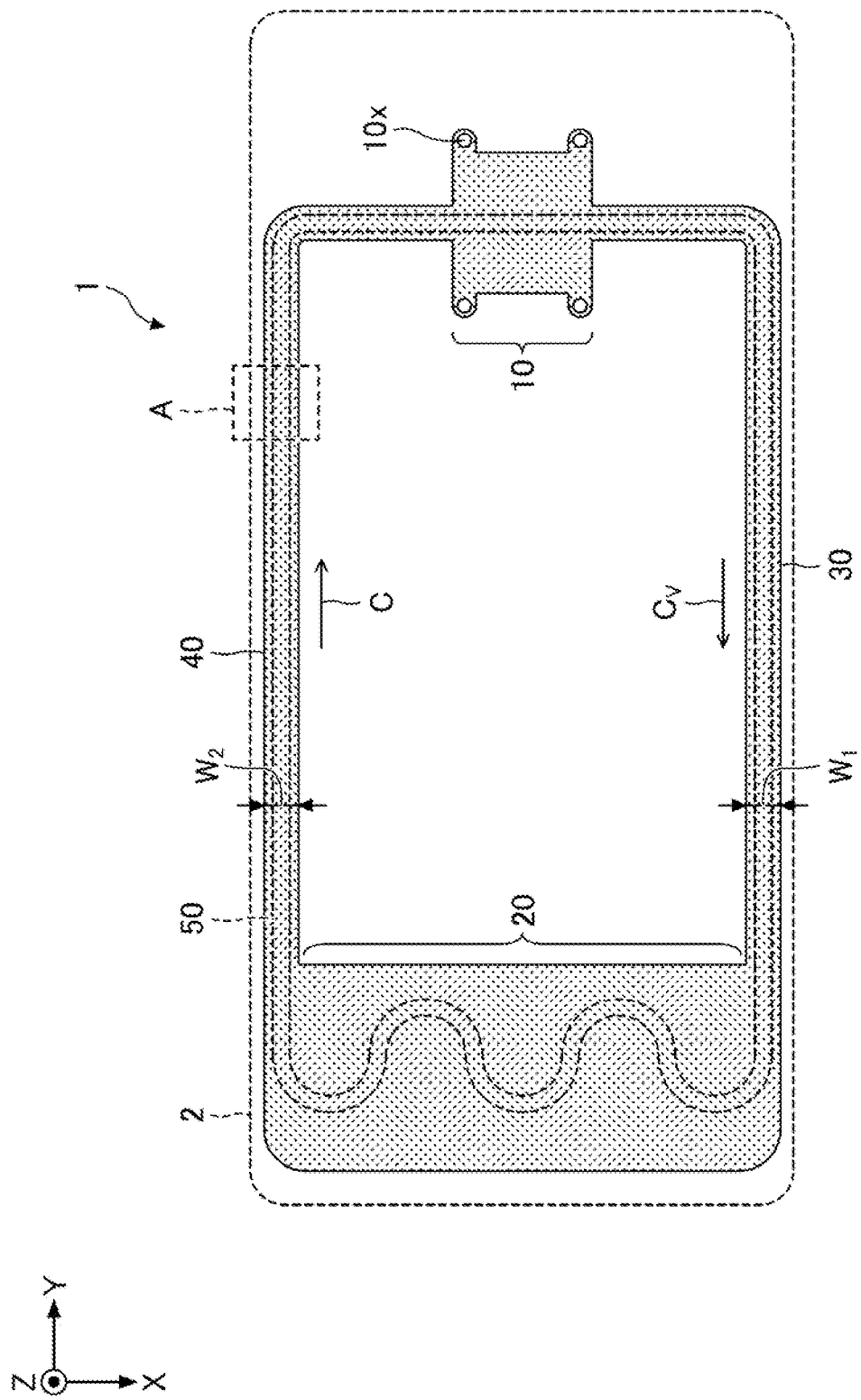
FIG. 1 is a plan view schematically illustrating an example of a loop heat pipe according to a first embodiment.

Preferred embodiments of the present invention will be described with reference to the accompanying drawings. In the drawings, those parts that are the same are designated by the same reference numerals, and a repeated description of the same parts may be omitted.

A description will now be given of embodiments of a loop heat pipe and a method for manufacturing the loop heat pipe according to the present invention.

First Embodiment

Structure of Loop Heat Pipe According to First Embodiment

First, a structure of the loop heat pipe according to a first embodiment will be described. FIG. 1 is a plan view schematically illustrating an example of the loop heat pipe according to the first embodiment.

As illustrated in FIG. 1, a loop heat pipe 1 includes an evaporator 10, a condenser 20, a vapor pipe 30, and a liquid pipe 40. The loop heat pipe 1 may be accommodated in a mobile electronic device 2, such as a smartphone, a tablet terminal, or the like, for example.

In the loop heat pipe 1, the evaporator 10 has a function to vaporize a working fluid C to generate vapor Cv. The condenser 20 has a function to liquefy the vapor Cv of the working fluid C. The evaporator 10 and the condenser 20 are connected via the vapor pipe 30 and the liquid pipe 40, and the vapor pipe 30 and the liquid pipe 40 form a loop shaped passage (or fluid channel) 50 in which the working fluid C or the vapor Cv flows.

Figure 2:
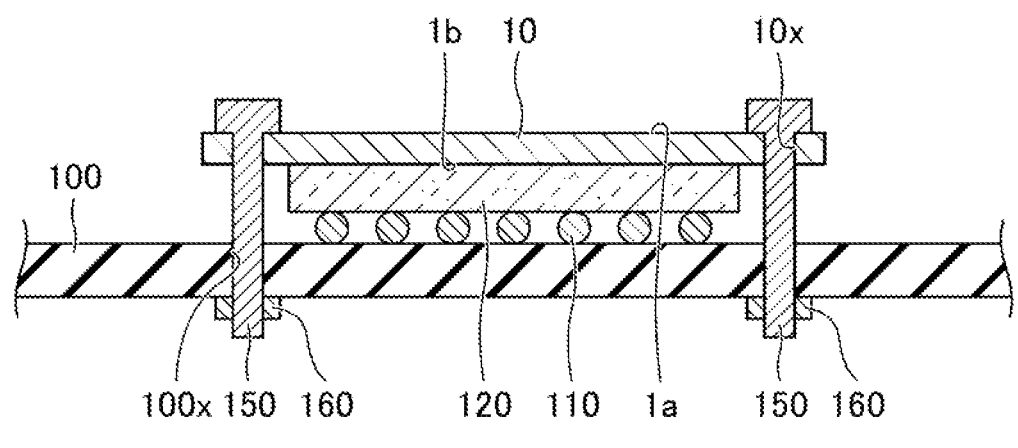
FIG. 2 is a cross sectional view of an evaporator and its periphery of the loop heat pipe according to the first embodiment.

FIG. 2 is a cross sectional view of the evaporator and its periphery of the loop heat pipe according to the first embodiment. As illustrated in FIG. 1 and FIG. 2, four through holes $10x$ are formed in the evaporator 10, for example. The evaporator 10 and a circuit board 100 may be fixed to each other, by inserting each bolt 150 through each through hole $10x$ formed in the evaporator 10, and each through hole $100x$ formed in the circuit board 100, and securing each bolt 150 by a nut 160 from a lower surface of the circuit board 100. The evaporator 10, the condenser 20, the vapor pipe 30, and the liquid pipe 40 have an upper surface $1a$, and a lower surface $1b$ on an opposite side from the upper surface $1a$. In the present disclosure, a plan view refers to a view that is viewed from above in a direction perpendicular to the upper surface $1a$.

For example, a heat-generating component 120, such as a CPU or the like, is mounted on the circuit board 100 via bumps 110, and an upper surface of the heat-generating component 120 makes direct contact with the lower surface $1b$ of the evaporator 10. The working fluid C inside the evaporator 10 is vaporized by the heat generated by the heat-generating component 120, to generate the vapor Cv.

As illustrated in FIG. 1, the vapor Cv generated by the evaporator 10 is guided to the condenser 20 through the vapor pipe 30, and liquefied in the condenser 20. Hence, the heat generated by the heat-generating component 120 is transferred to the condenser 20, thereby reducing a temperature rise of the heat-generating component 120. The working fluid C liquefied by the condenser 20 is guided to the evaporator 10 through the liquid pipe 40. A width $W_1$ of the vapor pipe 30 may be approximately 8 mm, for example. In addition, a width W2 of the liquid pipe 40 may be approximately 6 mm, for example.

The type of the working fluid C is not particularly limited, but in order to efficiently cool the heat-generating component 120 by the latent heat of vaporization, it is preferable to use a fluid having a high vapor pressure and a large latent heat of vaporization. Examples of such a fluid include ammonia, water, fluorocarbon, alcohol, and acetone, for example.

The evaporator 10, the condenser 20, the vapor pipe 30, and the liquid pipe 40 may be formed by a structure in which a plurality of metal layers are laminated. As will be described later in conjunction with FIG. 4 through FIG. 7, the evaporator 10, the condenser 20, the vapor pipe 30, and the liquid pipe 40 may be famed by a structure in which six metal layers 61 through 66 are laminated. In the evaporator 10, the condenser 20, the vapor pipe 30, and the liquid pipe 40, the metal layers 61 and 66 form the outermost metal layers, while the metal layers 62 through 65 form the intermediate metal layers. However, in the evaporator 10, the condenser 20, the vapor pipe 30, and the liquid pipe 40, a pair of outer metal layers may form the outermost metal layers, and one or a plurality of metal layers may form one or a plurality of intermediate metal layers, to form a structure in which the outermost metal layers and the one or plurality of intermediate metal layers are laminated.

The metal layers 61 through 66 are copper layers having a high thermal conductivity, for example, and the metal layers 61 through 66 are directly bonded to each other by solid phase (or solid-state) bonding or the like. Each of the metal layers 61 through 66 may have a thickness of approximately 50 μm to approximately 200 μm, for example. Of course, the metal layers 61 through 66 of the loop heat pipe 1 are not limited to the copper layers, and may be stainless steel layers, aluminum layers, magnesium alloy layers, or the like, for example. In addition, the number of metal layers that are laminated is not limited to a particular number, and may be five or less, or seven or more, for example.

Figure 3:
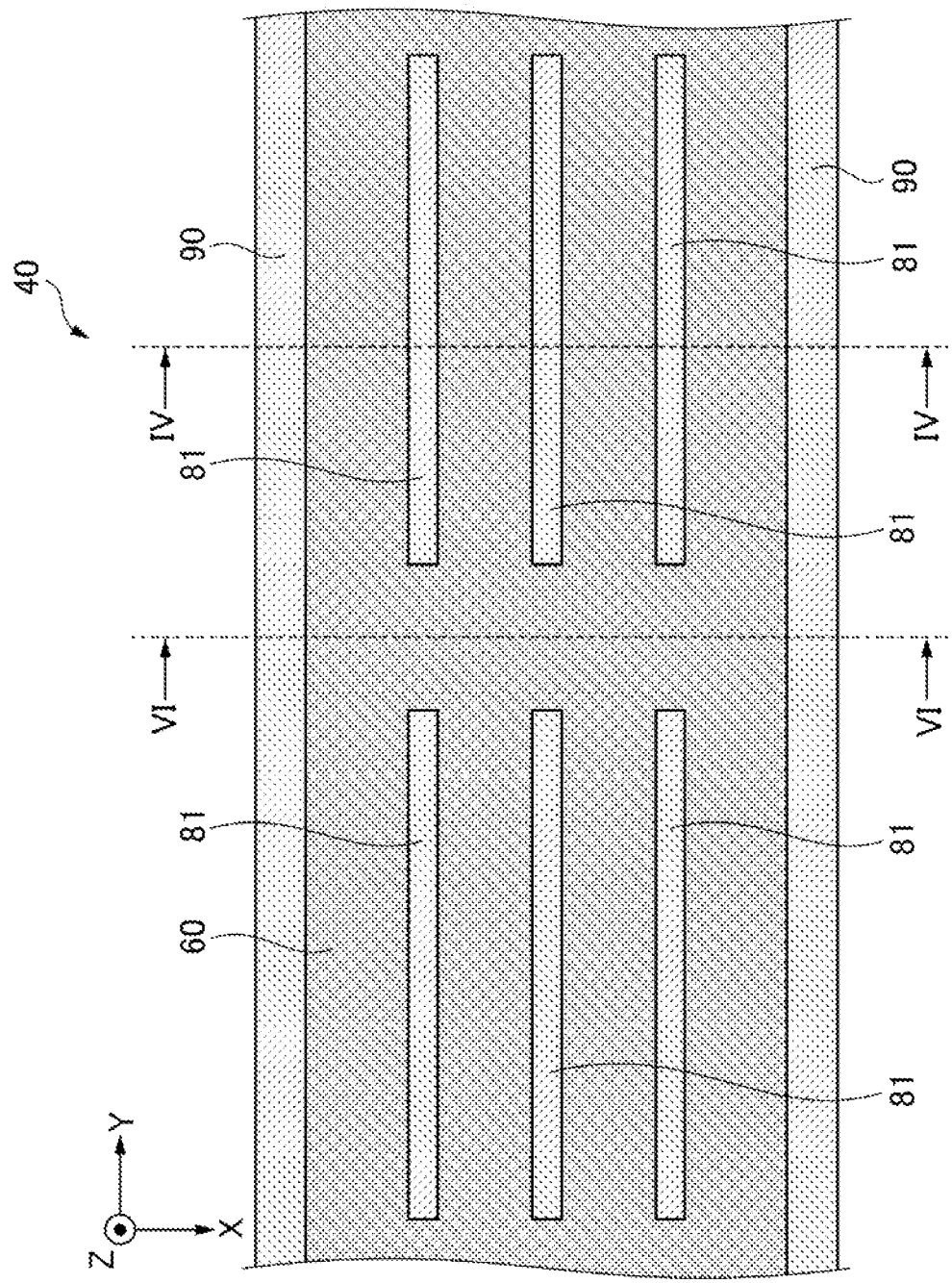
FIG. 3 is a plan view illustrating an example of a liquid pipe of the loop heat pipe according to the first embodiment.

In each of the evaporator 10, the condenser 20, the vapor pipe 30, and the liquid pipe 40, a pipe wall 90 illustrated in FIG. 3, which is formed by each of the laminated metal layers 61 through 66, is provided on both ends that are perpendicular to both a direction in which the working fluid C or the vapor Cv flows, and a laminating direction in which the metal layers 61 through 66 are laminated.

Figure 4:
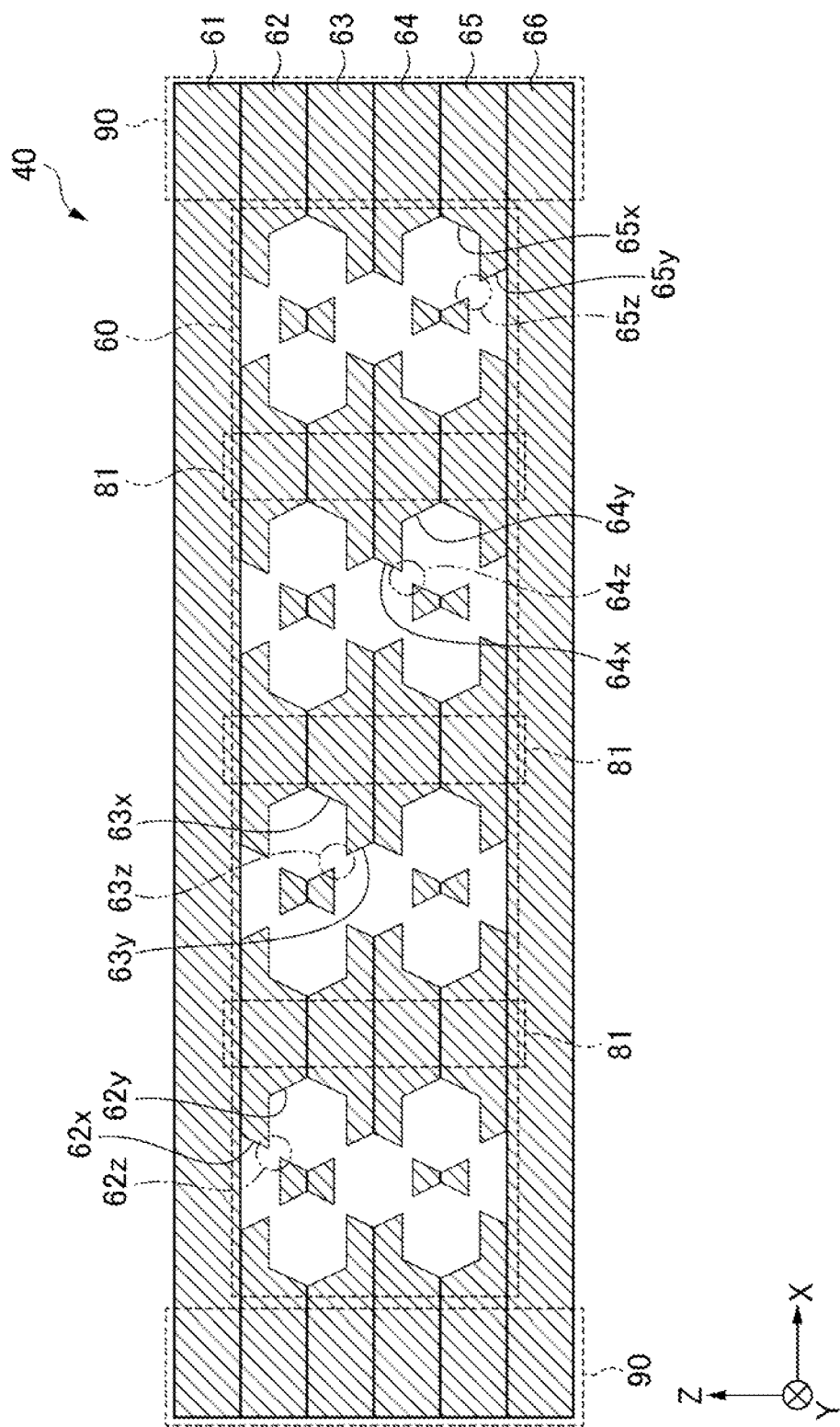
FIG. 4 is a cross sectional view (part 1) illustrating the example of the liquid pipe of the loop heat pipe according to the first embodiment.
Figure 5:
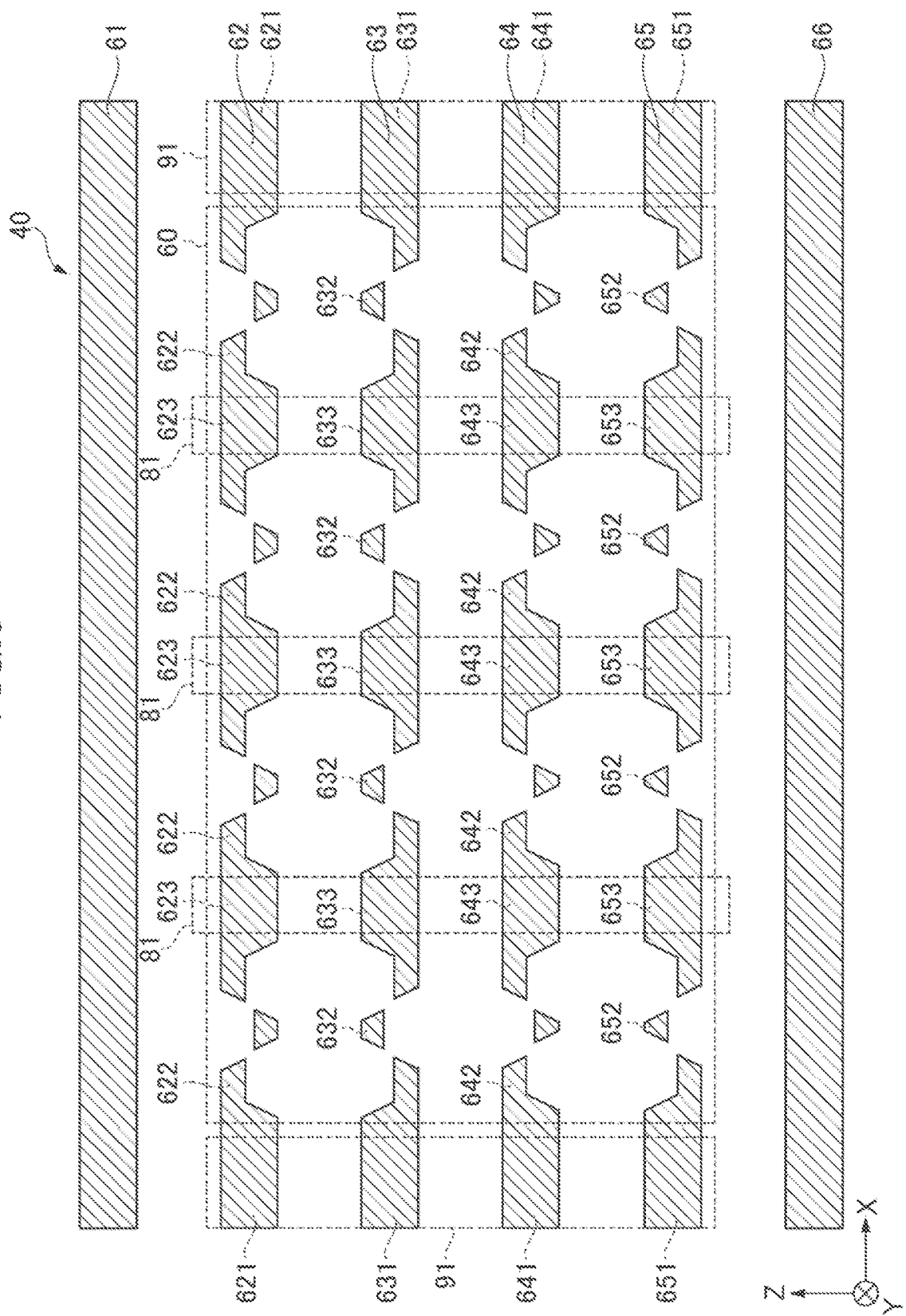
FIG. 5 is an exploded view of FIG. 4.
Figure 6:
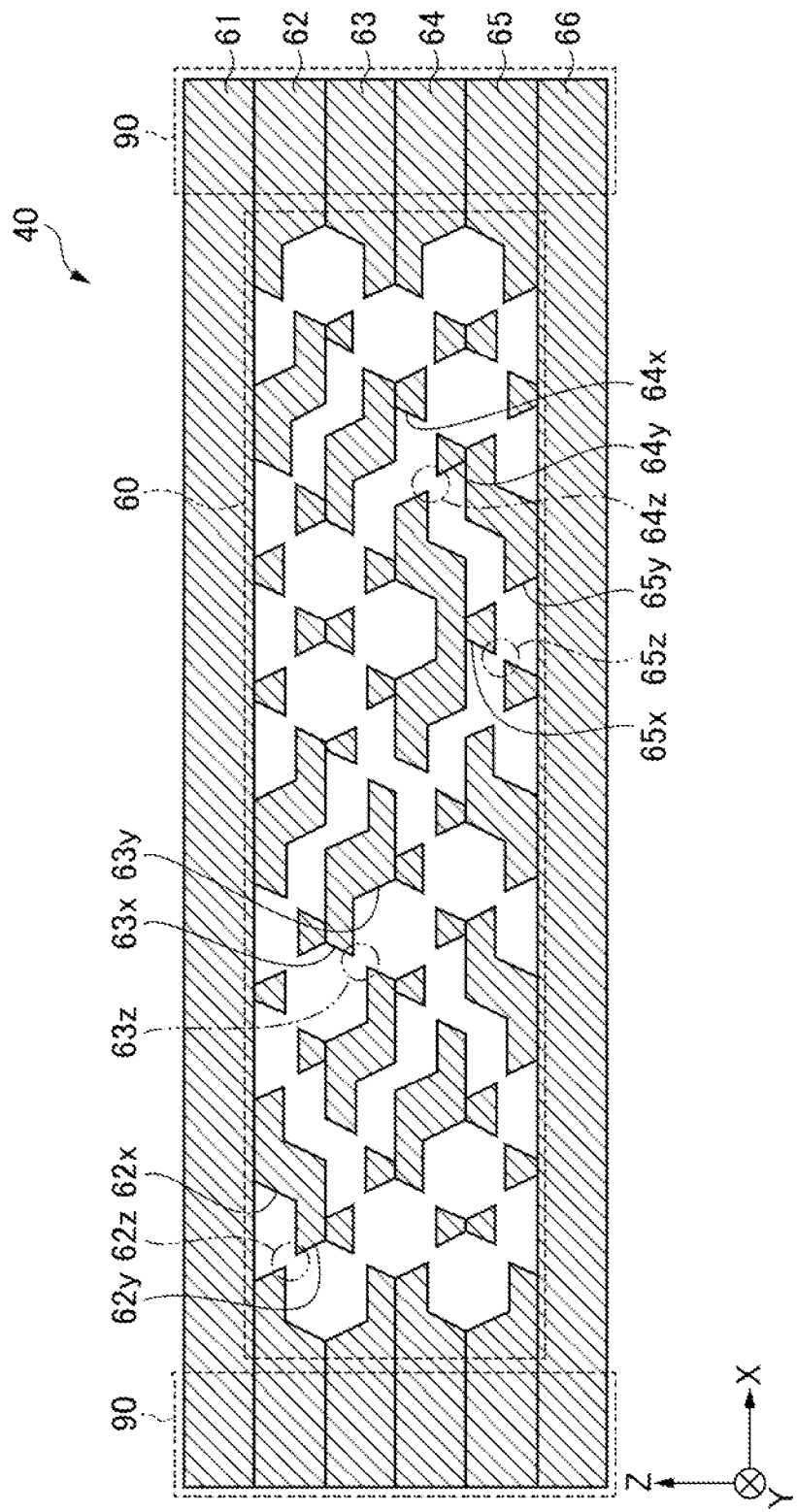
FIG. 6 is a cross sectional view (part 2) illustrating the example of the liquid pipe of the loop heat pipe according to the first embodiment.
Figure 7:
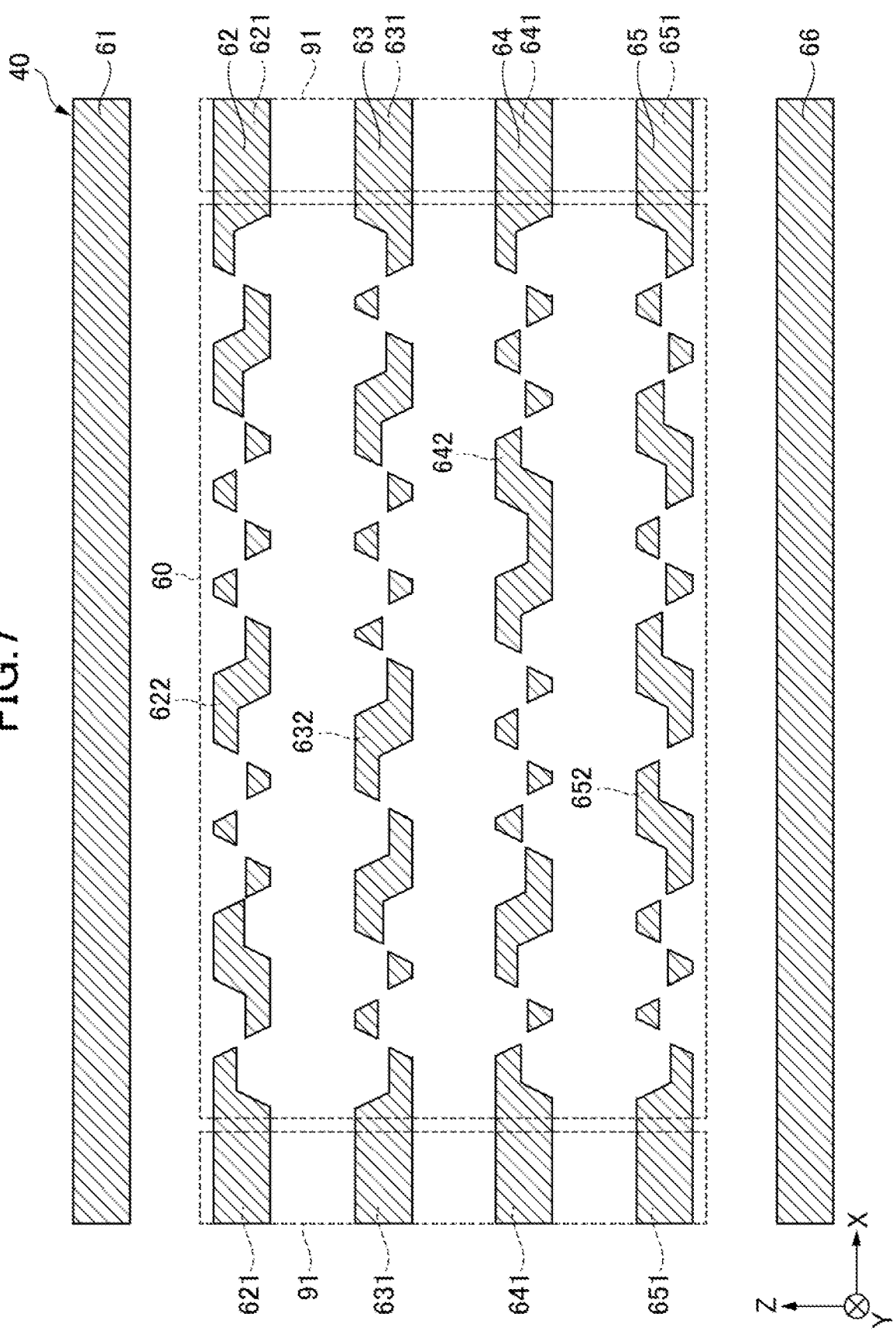
FIG. 7 is an exploded view of FIG. 6.

Next, the structure of the liquid pipe 40 will be described. FIG. 3 through FIG. 7 illustrate an example of the liquid pipe of the loop heat pipe according to the first embodiment. FIG. 3 is a plan view of a part A in FIG. 1. FIG. 4 is a cross sectional view along a line IV-IV in FIG. 3, and FIG. 5 is an exploded view of FIG. 4. FIG. 6 is a cross sectional view along a line VI-VI in FIG. 3, and FIG. 7 is an exploded view of FIG. 6. Because FIG. 3 illustrates the planar shapes of a porous body and structs inside the liquid pipe 40, the illustration of the metal layer (the metal layer 61 illustrated in FIG. 4 through FIG. 7) that is one of the outermost metal layers is omitted in FIG. 3. In FIG. 3 through FIG. 7, a Z-direction denotes the laminating direction of the metal layers 61 through 66, and an X-direction denotes an arbitrary direction in a plane perpendicular to the Z-direction, and a Y-direction denotes a direction perpendicular to the X-direction in this plane which is perpendicular to the Z-direction. The same applies to other subsequent figures. In the present disclosure, a plan view refers to a view viewed from the Z-direction.

As illustrated in FIG. 3 through FIG. 7, the intermediate metal layer (the metal layers 62 through 65) of the liquid pipe 40 is provided with a pair of walls 91 forming a part of the pipe wall 90, and a porous body 60 arranged between the pair of walls 91. In addition, the intermediate metal layer (the metal layers 62 through 65) of the liquid pipe 40 is provided with solid structs (or support columns) 81 which penetrate the porous body 60 and bonds the metal layer 61 and the metal layer 66.

The porous body 60 makes contact with a lower surface of the first metal layer 61 (one of the outermost metal layers) and an upper surface of the sixth metal layer 66 (the other of the outermost metal layers). No holes nor grooves, are formed in the metal layer 61 and the metal layer 66. On the other hand, as illustrated in FIG. 4 through FIG. 7, a plurality of bottomed holes 62x and a plurality of bottomed holes 62y are formed in the second metal layer 62 forming the porous body 60. The bottomed holes 62x cave in from an upper surface of the metal layer 62 to an approximate center portion along a thickness direction of the metal layer 62, and does not reach a lower surface of the metal layer 62. The bottomed holes 62y cave in from the lower surface of the metal layer 62 to the approximate center portion along the thickness direction of the metal layer 62, and does not reach the upper surface of the metal layer 62.

The bottomed hole 62x and the bottomed hole 62y are alternately arranged along the X-direction in the plan view. Further, the bottomed hole 62x and the bottomed hole 62y are alternately arranged along the Y-direction in the plan view. The bottomed hole 62x and the bottomed hole 62y that are alternately arranged along the X-direction partially overlap each other in the plan view, and overlapping portions of the bottomed hole 62x and the bottomed hole 62y communicate with each other to form a pore 62z. The bottomed hole 62x and the bottomed holes 62y that alternately arranged along the Y-direction are formed with a predetermined spacing therebetween, and do not overlap in the plan view. Accordingly, the bottomed hole 62x and the bottomed hole 62y that are alternately arranged along the Y-direction do not form a pore.

The bottomed holes 62x and 62y may have a circular shape with a diameter of approximately 100 μm to approximately 300 μm, for example, but may have an arbitrary shape, such as an elliptical shape, a polygonal shape, or the like. A depth of the bottomed holes 62x and 62y along the thickness direction may be approximately one-half the thickness of the metal layer 62, for example. The spacing between two mutually adjacent bottomed holes 62x may be approximately 100 μm to approximately 400 μm, for example. The spacing between two mutually adjacent bottomed holes 62y may be approximately 100 μm to approximately 400 μm, for example.

Inner wall surfaces of the bottomed holes 62x and 62y may have a tapered shape which is tapered to widen from a bottom surface toward an opening of the bottomed holes 62x and 62y. However, the inner wall surfaces of the bottomed holes 62x and 62y are not limited to the tapered shape, and may have a vertical shape formed perpendicularly to the bottom surface. The shape of the inner wall surfaces of the bottomed holes 62x and 62y is not limited to the tapered shape or the vertical shape. For example, the inner wall surfaces of the bottomed holes 62x and 62y may have a concave shape formed by a curved surface. Examples of the concave shape formed by the curved surface include concave shapes having cross sectional shapes that are approximately semi-circular or approximately semi-elliptical, for example. A width of the pore 62z along a short direction may be approximately 10 μm to approximately 50 μm, for example. In addition, a width of the pore 62z along a longitudinal direction may be approximately 50 μm to approximately 150 μm, for example.

As illustrated in FIG. 4 through FIG. 7, a plurality of bottomed holes 63x and a plurality of bottomed holes 63y are formed in the third metal layer 63 forming the porous body 60. The bottomed holes 63x cave in from an upper surface of the metal layer 63 to an approximate center portion along a thickness direction of the metal layer 63, and does not reach a lower surface of the metal layer 63. The bottomed holes 63y cave in from the lower surface of the metal layer 63 to the approximate center portion along the thickness direction of the metal layer 63, and does not reach the upper surface of the metal layer 63.

In the metal layer 63, a row in which only the bottomed holes 63x are arranged along the X-direction, and a row in which only the bottomed holes 63y is arranged along the X-direction, are alternately arranged along the Y-direction. In the rows that are alternately arranged along the Y-direction, the bottomed hole 63x and the bottomed hole 63y in two mutually adjacent rows partially overlap in the plan view, and the overlapping portions of the bottomed hole 63x and the bottomed hole 63y communicate with each other to form a pore 63z.

However, center positions of the adjacent bottomed holes 63x and 63y forming the pore 63z are offset along the X-direction. In other words, the bottomed holes 63x and 63y forming the pore 63z are alternately arranged along an oblique direction with respect to the X-direction and the Y-direction. The shape of the bottomed holes 63x and 63y, the shape of the pore 63z, or the like may be similar to the shape of the bottomed holes 62x and 62y, the shape of the pore 62z, or the like.

The bottomed hole 62y of the metal layer 62 and the bottomed hole 63x of the metal layer 63 are formed at overlapping positions in the plan view. For this reason, no pores are formed at the interface between the metal layer 62 and the metal layer 63. The bottomed hole 62y and the bottomed hole 63x may be offset to partially overlap each other in the plan view, thereby forming a pore at the interface between the metal layer 62 and the metal layer 63.

As illustrated in FIG. 4 through FIG. 7, a plurality of bottomed holes 64x and a plurality of bottomed holes 64y are formed in the fourth metal layer 64 forming the porous body 60. The bottomed hole 64x caves in from an upper surface of the fourth metal layer 64 towards an approximate center portion along the thickness direction of the fourth metal layer 64. The bottomed hole 64y caves in from a lower surface of the fourth metal layer 64 towards the approximate center portion along the thickness direction of the fourth metal layer 64.

The bottomed hole 64x and the bottomed hole 64y are alternately arranged along the X-direction in the plan view. In addition, the bottomed hole 64x and the bottomed hole 64y are alternately arranged along the Y-direction in the plan view. The bottomed hole 64x and the bottomed hole 64y that are alternately arranged along the X-direction partially overlap each other in the plan view, and the overlapping portions of the bottomed holes 64x and 64y communicate with each other to form a pore 64z. The bottomed hole 64x and bottomed hole 64y that are alternately arranged along the Y-direction are formed with a predetermined spacing therebetween, and do not overlap in the plan view. Accordingly, the bottomed hole 64x and the bottomed hole 64y that are alternately arranged along the Y-direction do not form a pore. The shape of the bottomed holes 64x and 64y, the shape of the pore 64z, or the like may be similar to the shape of the bottomed holes 62x and 62y, the shape of the pore 62z, or the like.

The bottomed hole 63y of the metal layer 63 and the bottomed hole 64x of the metal layer 64 are formed at overlapping positions in the plan view. For this reason, no pores are formed at the interface between the metal layer 63 and the metal layer 64. The bottomed hole 63y and the bottomed hole 64x may be offset to partially overlap each other in the plan view, thereby forming a pore at the interface between the metal layer 63 and the metal layer 64.

As illustrated in FIG. 4 through FIG. 7, a plurality of bottomed holes 65x and a plurality of bottomed holes 65y are formed in the fifth metal layer 65 forming the porous body 60. The bottomed hole 65x caves in from an upper surface of the fifth metal layer 65 towards an approximate center portion along the thickness direction of the fifth metal layer 65. The bottomed hole 65y caves in from a lower surface of the fifth metal layer 65 towards the approximate center portion along the thickness direction of the fifth metal layer 65.

In the metal layer 65, a row in which only the bottomed holes 65x are arranged along the X-direction, and a row in which only the bottomed holes 65y are arranged along the X-direction, are alternately arranged along the Y-direction. In the rows that are alternately arranged along the Y-direction, the bottomed hole 65x and the bottomed hole 65y in two mutually adjacent rows partially overlap each other in the plan view, and the overlapping portions of the bottomed holes 65x and 65y communicate with each other to form a pore 65z.

However, center positions of the adjacent bottomed holes 65x and 65y forming the pore 65z are offset along the X-direction. In other words, the bottomed holes 65x and 65y forming the pore 65z are alternately arranged along an oblique direction with respect to the X-direction and the Y-direction. The shape of the bottomed holes 65x and 65y, the shape of the pore 65z, or the like may be similar to the shape of the bottomed holes 62x and 62y, the shape of the pore 62z, or the like.

The bottomed hole 64y of the metal layer 64 and the bottomed hole 65x of the metal layer 65 are formed at overlapping positions in the plan view. For this reason, no pores are formed at the interface between the metal layer 64 and the metal layer 65. The bottomed hole 64y and the bottomed hole 65x may be offset to partially overlap each other in the plan view, thereby forming a pore at the interface between the metal layer 64 and the metal layer 65.

The pores formed in each of the metal layers communicate with each other, and the mutually communicating pores spread three-dimensionally inside the porous body 60. For this reason, the working fluid C spreads three-dimensionally through the mutually communicating pores due to a capillary force.

At least a portion of the bottomed holes forming the porous body 60 communicate to the passage 50 inside the condenser 20. Hence, the working fluid C can permeate into the porous body 60.

Accordingly, the porous body 60 is provided inside the liquid pipe 40, and the porous body 60 extends along the liquid pipe 40 to a proximity of the evaporator 10. Thus, the capillary force generated in the porous body 60 guides the working fluid C in the liquid phase inside the liquid pipe 40 to the evaporator 10.

As a result, a backflow of the vapor Cv into the liquid pipe 40 due to a heat leak or the like from the evaporator 10, can be pushed back due to the capillary force from the porous body 60 acting on the working fluid C in the liquid phase, thereby preventing the backflow of the vapor Cv.

Although an inlet (not illustrated) for injecting the working fluid C is formed in the liquid pipe 40, the inlet is sealed by a sealing member, and the inside of the loop heat pipe 1 is maintained airtight.

The strut 81 is arranged at a plurality of positions inside the liquid pipe 40, for example, and to penetrate the porous body 60. The struts 81 extends along the liquid pipe 40, and has a rectangular planar shape that is elongated in the direction (Y-direction) in which the working fluid C flows in the plan view, for example. For example, the struts 81 have a lattice-like arrangement in the plan view. In other words, a plurality of struts 81 are arranged side by side along the Y-direction, and a plurality of struts 81 are arranged side by side along the X-direction.

As illustrated in FIG. 4 through FIG. 7, a first part 621 forming a part of the wall 91, a second part 622 forming a part of the porous body 60, and a third part 623 forming a part of the strut 81, are provided in the second metal layer 62. The second part 622 is connected to the first part 621, and the third part 623 is connected to the second part 622. No holes nor grooves are famed in the first part 621 and the third part 623. A bottomed hole 62x, a bottomed hole 62y, and a pore 62z are formed in the second part 622. As will be described later, the first part 621, the second part 622, and the third part 623 are formed by etching a single metal layer. In other words, the first part 621, the second part 622, and the third part 623 are integrally formed.

As illustrated in FIG. 4 through FIG. 7, a first part 631 forming a part of the wall 91, a second part 632 forming apart of the porous body 60, and a third part 633 forming a part of the strut 81, are provided in the third metal layer 63. The second part 632 is connected to the first part 631, and the third part 633 is connected to the second part 632. No holes nor grooves are formed in the first part 631 and the third part 633. A bottomed hole 63x, a bottomed hole 63y, and a pore 63z are formed in the second part 632. As will be described later, the first part 631, the second part 632, and the third part 633 are formed by etching a single metal layer. In other words, the first part 631, the second part 632, and the third part 633 are integrally formed.

As illustrated in FIG. 4 through FIG. 7, a first part 641 forming a part of the wall 91, a second part 642 forming a part of the porous body 60, and a third part 643 forming a part of the strut 81, are formed in the fourth metal layer 64. The second part 642 is connected to the first part 641, and the third part 643 is connected to the second part 642. No holes nor grooves are formed in the first part 641 and the third part 643. A bottomed hole 64x, a bottomed hole 64y, and a pore 64z are formed in the second part 642. As will be described later, the first part 641, the second part 642, and the third part 643 are formed by etching a single metal layer. In other words, the first part 641, the second part 642, and the third part 643 are integrally formed.

As illustrated in FIG. 4 through FIG. 7, the fifth layer of the metal layer 65 is provided with a first part 651 forming a part of the wall 91, a second part 652 forming a part of the porous body 60, and a third part 653 forming a part of the strut 81. The second part 652 is connected to the first part 651, and the third part 653 is connected to the second part 652. No holes nor grooves are formed in the first part 651 and the third part 653. A bottomed hole 65x, a bottomed hole 65y, and a pore 65z are formed in the second part 652. As will be described later, the first part 651, the second part 652, and the third part 653 are formed by etching a single metal layer. In other words, the first part 651, the second part 652, and the third part 653 are integrally formed.

The first parts 621, 631, 641, and 651 are solid portions. The third parts 623, 633, 643, and 653 are also solid portions. In the plan view, the first parts 621, 631, 641, and 651 overlap each other, the second parts 622, 632, 642, and 652 overlap each other, and the third parts 623, 633, 643, and 653 overlap each other. Further, as described above, the metal layers 61 through 66 are directly bonded to each other by solid phase bonding or the like. The first parts 621, 631, 641, and 651 are bonded to each other to form the walls 91. The pipe wall 90 is formed from a portion of the metal layer 61, the walls 91, and a portion of the metal layer 66. The second parts 622, 632, 642, and 652 are bonded to each other to form the porous body 60. The third parts 623, 633, 643, and 653 are bonded to each other to form the solid strut 81. The strut 81 is bonded to the metal layer 61 and the metal layer 66.

Figure 8:
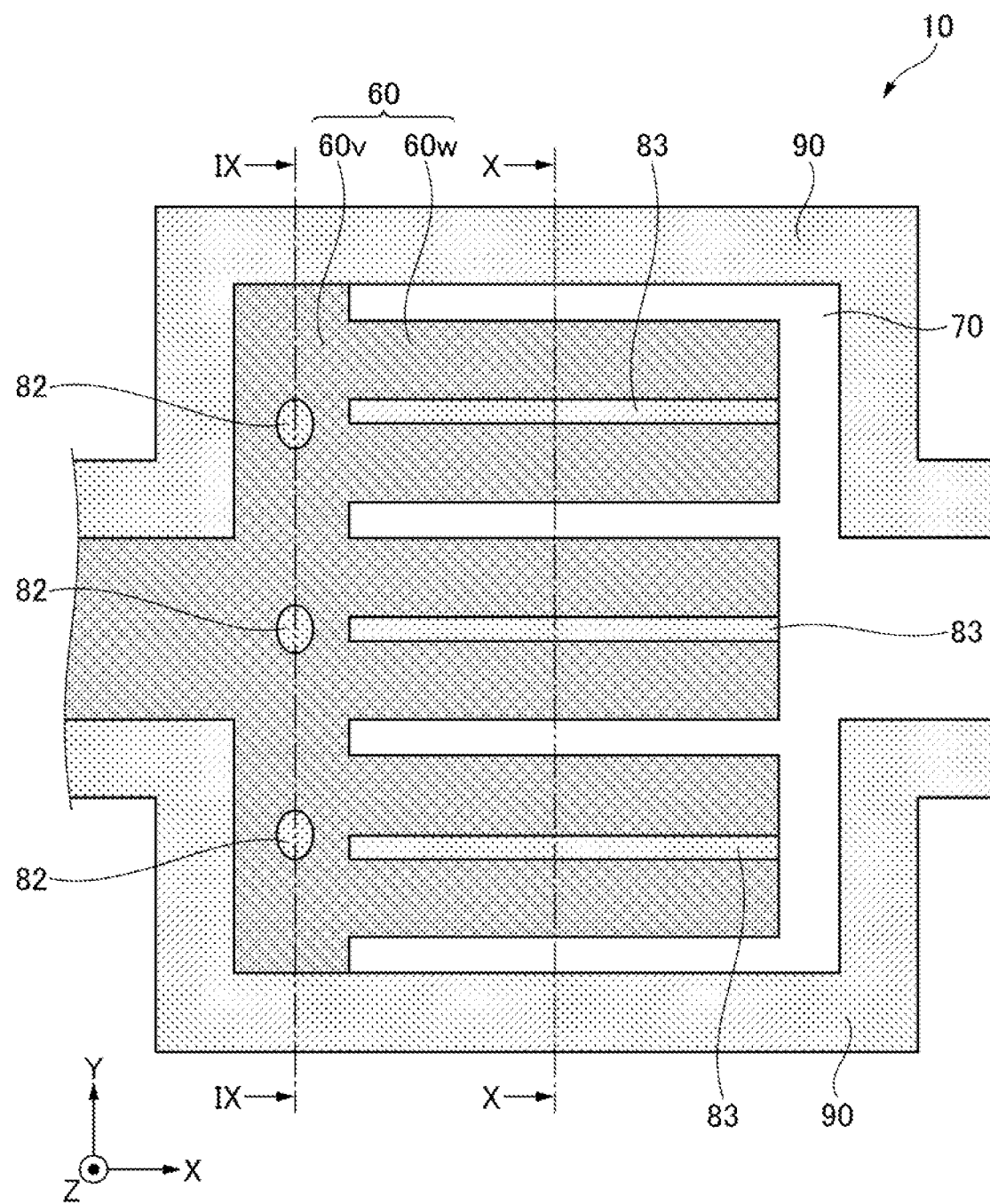
FIG. 8 is a plan view illustrating an example of an evaporator of the loop heat pipe according to the first embodiment.
Figure 9:
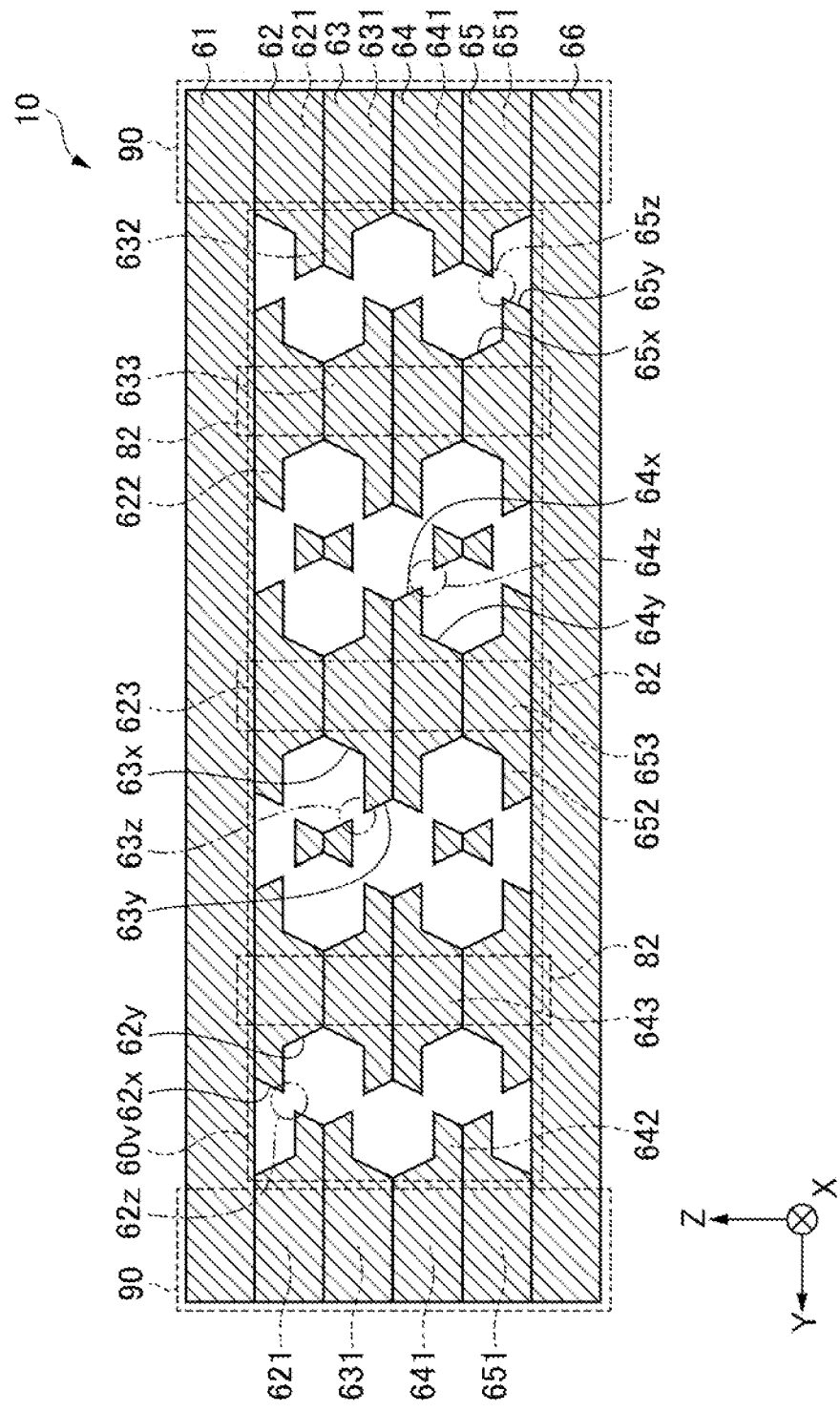
FIG. 9 is a cross sectional view (part 1) illustrating the example of the evaporator of the loop heat pipe according to the first embodiment.
Figure 10:
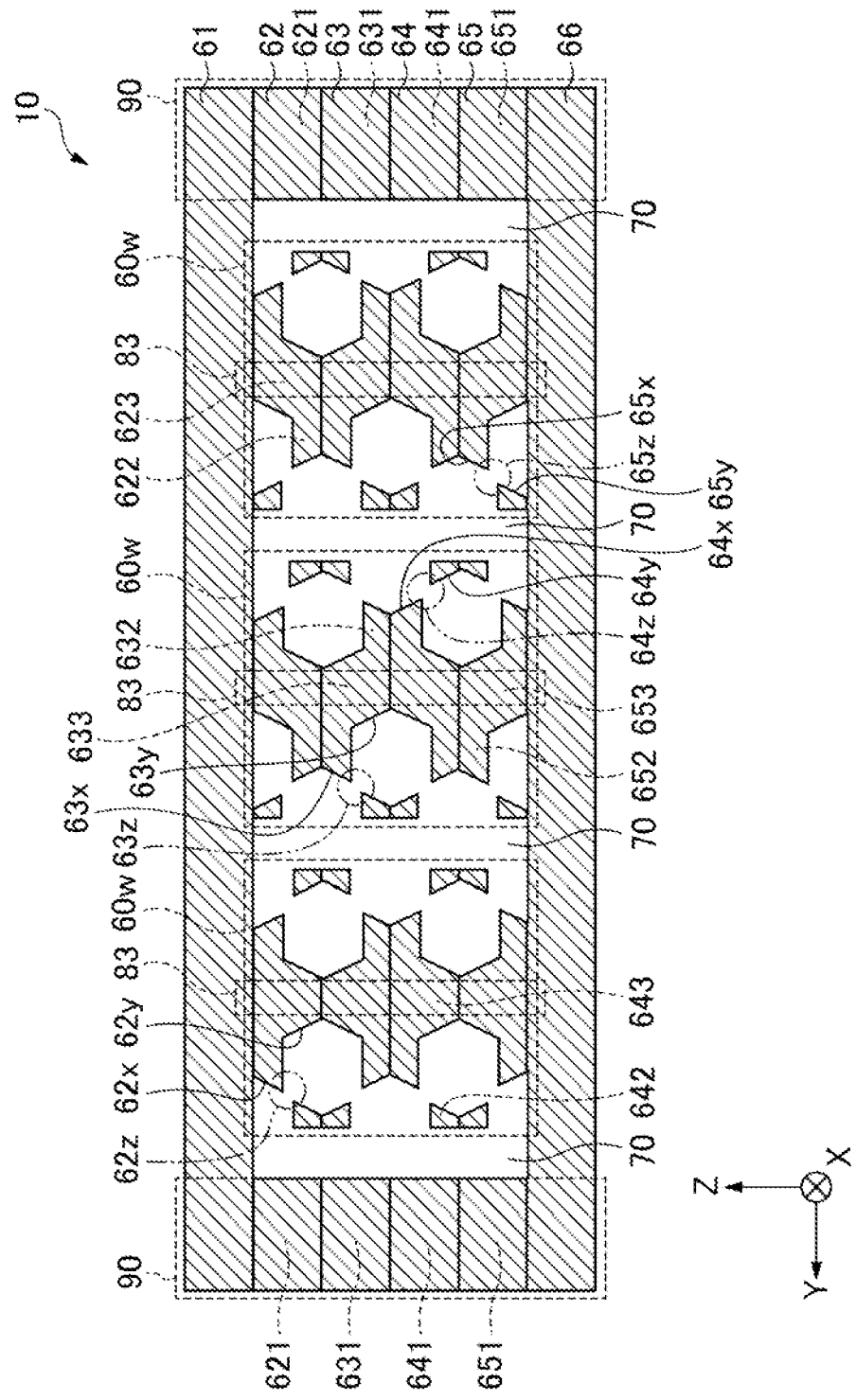
FIG. 10 is a cross sectional view (part 2) illustrating the example of the evaporator of the loop heat pipe according to the first embodiment.

Next, the structure of evaporator 10 will be described. FIG. 8 through FIG. 10 illustrate an example of the evaporator of the loop heat pipe according to the first embodiment. FIG. 8 is a plan view of the evaporator. FIG. 9 is a cross sectional view along a line IX-IX in FIG. 8. FIG. 10 is a cross sectional view along a line X-X in FIG. 8. In FIG. 8, the metal layer (the metal layer 61 illustrated in FIG. 9 and FIG. 10), which is one of the outermost metal layers, is not illustrated in order to illustrate the planar shapes of the porous body and the strut in the evaporator 10.

As illustrated in FIG. 8 through FIG. 10, the intermediate metal layer (the metal layers 62 through 65) of the evaporator 10 is provided with the pair of walls 91 forming a part of the pipe wall 90, and the porous body 60 between the pair of walls 91. The intermediate metal layer (the metal layers 62 through 65) of the evaporator 10 is also provided with solid struts 82 and 83 which penetrate the porous body 60, and bond the metal layer 61 and the metal layer 66.

As illustrated in FIG. 8, the porous body 60 in the evaporator 10 includes a connecting part 60v, and a plurality of projecting parts 60w.

In the plan view, the connecting part 60v is provided on the side closest to the liquid pipe 40 along the X-direction (the side to which the liquid pipe 40 is connected to the evaporator 10), and extends along the Y-direction. A portion of a surface of the connecting part 60v on the side of the liquid pipe 40 makes contact with the pipe wall 90 of the evaporator 10, and the remaining portion connects to the porous body 60 inside the liquid pipe 40. A portion of the surface of the connecting part 60v on the side of the vapor pipe 30 is connected to the projecting parts 60w, and the remaining portion makes contact with a space 70.

The projecting parts 60w project from the connecting part 60v toward the vapor pipe 30 in the plan view.

The projecting parts 60w are arranged side by side at predetermined intervals along the Y-direction, and a first end of each of the projecting parts 60w on the side of the vapor pipe 30 is separated from the pipe wall 90 of the evaporator 10. Further, the first ends of the projecting parts 60w on the side of the vapor pipe 30 are not connected to each other. On the other hand, second ends of each of the projecting parts 60w on the side of the liquid pipe 40 are connected via the connecting part 60v. In other words, the porous body 60 inside the evaporator 10 is formed to a comb-like shape in the plan view, including the connecting part 60v and the plurality of projecting parts 60w.

The space 70 is formed inside the evaporator 10 in a region where the porous body 60 is not provided. The space 70 connects to the passage 50 of the vapor pipe 30.

The working fluid C from the liquid pipe 40 is guided toward the evaporator 10, and permeates into the porous body 60. The working fluid C permeated into the porous body 60 in the evaporator 10 is vaporized by the heat generated by the heat-generating component 120, thereby generating the vapor Cv which flows through the space 70 inside the evaporator 10 toward the vapor pipe 30. FIG. 8 illustrates an example in which the number of projecting parts 60w (the number of teeth of the comb-like shape) is three, however, the number of projecting parts 60w may be determined, as appropriate. As the contact area between the projecting parts 60w and the space 70 increases, the working fluid C is more easily evaporated, thereby reducing the pressure loss (or pressure drop).

The strut 82 is arranged at a plurality of positions within the connecting part 60v, for example, and to penetrate the porous body 60. The strut 82 has an elliptical planar shape with the X-direction being the minor axis direction, and the Y-direction being the major axis direction, for example. For example, a plurality of struts 82 are arranged side by side along the Y-direction.

One strut 83 is arranged within each projecting part 60w, for example, and to penetrate the porous body 60. The strut 83 has a rectangular planar shape that is elongated in the X-direction, for example.

The porous body 60 inside the evaporator 10 has a structure similar to the structure of the porous body 60 inside the liquid pipe 40. The struts 82 and 83 have structures similar to the structure of the strut 81. In other words, the first parts 621, 631, 641, and 651 of the metal layers 62 through 65 are bonded to each other to form the walls 91. The pipe wall 90 of evaporator 10 is formed from a portion of metal layer 61, the walls 91, and a portion of metal layer 66. The second parts 622, 632, 642, and 652 of the metal layers 62 through 65 are bonded to each other to form the porous body 60 inside the evaporator 10. The third parts 623, 633, 643, and 653 of the metal 30' layers 62 through 65 are bonded to each other to form solid struts 82 and 83. The struts 82 and 83 are bonded to the metal layer 61 and the metal layer 66.

Accordingly, the liquid pipe 40 is provided with the struts 81 which connect the metal layer 61 and the metal layer 66. In addition, the evaporator 10 is provided with the struts 82 and 83 which connect the metal layer 61 and the metal layer 66. For this reason, it is possible to reduce the deformation of the loop heat pipe 1 even if the volume of the working fluid C or the vapor Cv thereof varies due to changes in the temperature, such as the environmental temperature or the like at which the loop heat pipe 1 is used. Because the struts 81 through 83 are solid members, that is, solid members without holes, grooves, or the like, the struts 81 through 83 can strongly bond the metal layer 61 and the metal layer 66 to each other.

If the struts 81, 82, and 83 were not provided, the volume of the working fluid C would vary due to the phase change in the liquid working fluid C permeated into the porous body 60, thereby causing peeling (or separation) between the porous body 60 and the metal layer 61, and between the porous body 60 and the metal layer 66. If such a peeling were to occur, the working fluid C would permeate into the interface where the peeling occurs, thereby increasing the volume variation. Further, if a large volume variation were to occur, members or the like in a periphery of the loop heat pipe 1 would receive stress and become compressed, or the metal layers 61 and 66 would break near the pipe wall 90.

On the other hand, in this embodiment, because the struts 81, 82, and 83 are provided so as to penetrate the porous body 60, it is possible to reduce a change in the distance between the metal layer 61 and the metal layer 66 in the periphery of the porous body 60, even if a temperature change, on the same order as the temperature described above, occurs. In other words, it is possible to reduce the deformation, such as expansion or the like of the loop heat pipe 1, and to reduce the peeling between the porous body 60 and the metal layer 61, and between the porous body 60 and the metal layer 66.

Method for Manufacturing Loop Heat Pipe According to First Embodiment

Next, a method for manufacturing the loop heat pipe according to the first embodiment will be described, by focusing on a method for manufacturing the porous body. FIG. 11A through FIG. 12B are diagrams illustrating examples of steps (or processes) for manufacturing the loop heat pipe according to the first embodiment. FIG. 11A through FIG. 12B illustrate cross sections corresponding to FIG. 4. In FIG. 11A through FIG. 12B, a process similar to the process performed with respect to the cross section corresponding to FIG. 4 is also performed with respect to the cross sections corresponding to FIG. 6, FIG. 9, and FIG. 10, however, illustration thereof will be omitted.

Figure 11A:
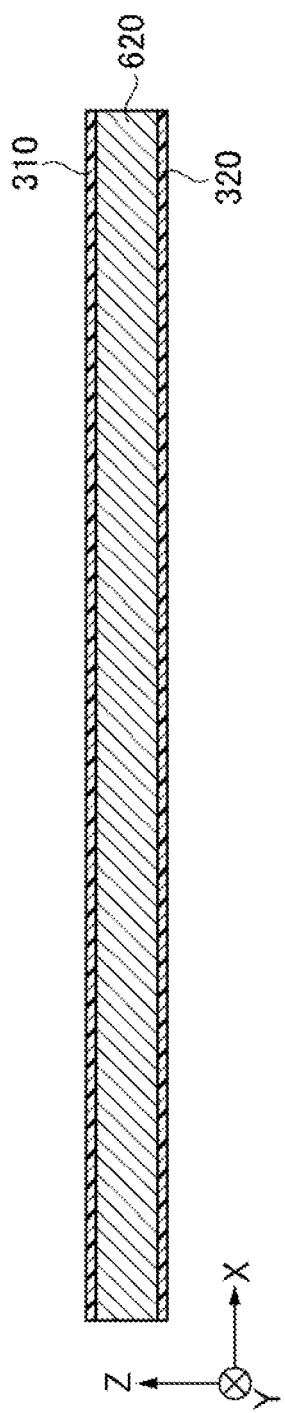
FIG. 11A, FIG. 11B, FIG. 11C, and FIG. 11D are diagrams (part 1) illustrating examples of steps for manufacturing the loop heat pipe according to the first embodiment.

First, in the process illustrated in FIG. 11A, a metal sheet 620 formed to the planar shape illustrated in FIG. 1 is prepared. Then, a resist layer 310 is formed on an upper surface of the metal sheet 620, and a resist layer 320 is formed on a lower surface of the metal sheet 620. The metal sheet 620 is a member that ultimately becomes the metal layer 62, and may be formed of copper, stainless steel, aluminum, magnesium alloys, or the like, for example. The thickness of the metal sheet 620 may be approximately 50 μm to approximately 200 μm. A photosensitive dry film resist or the like, for example, may be used for the resist layers 310 and 320.

Figure 11B:
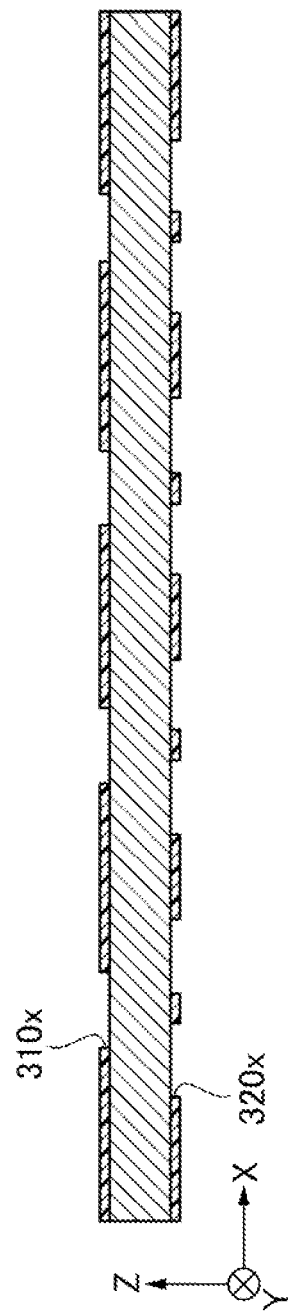

Next, in the process illustrated in FIG. 11B, the resist layer 310 is exposed and developed in a region of the metal sheet 620, where the porous body 60 is to be formed, thereby forming openings 310x which selectively expose the upper surface of the metal sheet 620. In addition, the resist layer 320 is exposed and developed to form openings 320x which selectively expose the lower surface of the metal sheet 620. The shapes and arrangements of the openings 310x and 320x are set to correspond to the shapes and arrangements of the bottomed holes 62x and 62y illustrated in FIG. 4.

Figure 11C:
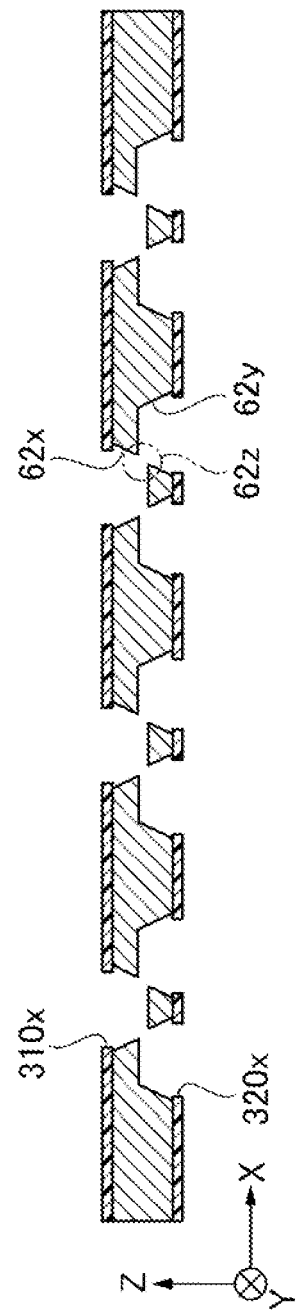

Next, in the process illustrated in FIG. 11C, the metal sheet 620 exposed within the opening 310x is half-etched from the upper surface of the metal sheet 620, while the metal sheet 620 exposed within the opening 320x is half-etched from the lower surface of the metal sheet 620. Hence, the bottomed holes 62x are formed in the upper surface of the metal sheet 620, and the bottomed holes 62y are formed in the lower surface of the metal sheet 620. In addition, because the openings 310x and 320x are alternately arranged along the X-direction in the upper and lower surface of the metal sheet 620, and partially overlap each other in the plan view, the overlapping portions communicate with each other to form the pore 62z. The half-etching of the metal sheet 620 may use a ferric chloride solution, for example.

Figure 11D:
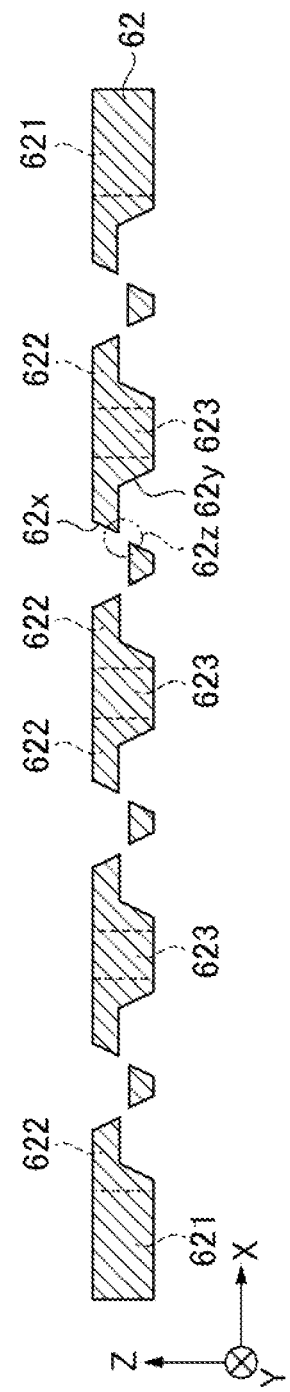

Next, in the process illustrated in FIG. 11D, the resist layers 310 and 320 are stripped using a stripping liquid. As a result, the metal layer 62 is completed. The metal layer 62 includes the first part 621, the second part 622, and the third part 623. Hence, the first part 621, the second part 622, and the third part 623 are formed by etching the single metal sheet 620. As illustrated in FIG. 11D, the second part 622 and the third part 623 are connected to each other. Further, the first part 621 and the second part 622 are connected to each other via a portion which is not visible in the cross section illustrated in FIG. 11D.

Next, in the process illustrated in FIG. 12A, the solid metal layers 61 and 66 having no holes nor grooves are prepared. In addition, the metal layers 63, 64, and 65 are formed in a manner similar to the metal layer 62. The positions of the bottomed holes and the pores formed in the metal layers 63, 64, and 65 may be as illustrated in FIG. 4, for example.

Next, in the process illustrated in FIG. 12B, the metal layers 61 through 65 are laminated in the order illustrated in FIG. 12A, and bonded to each other by the solid phase bonding by pressing and heating. In this state, the positions of the third parts 623 through 653 of the metal layers 62 through 65 are aligned to overlap with each other in the plan view. Accordingly, the mutually adjacent metal layers of the metal layers 61 through 65 are directly bonded to each other, thereby completing the loop heat pipe 1 having the evaporator 10, the condenser 20, the vapor pipe 30, and the liquid pipe 40, and forming the porous body 60 inside the liquid pipe 40 and the evaporator 10. Moreover, the struts 81 through 83 are formed to penetrate the porous body 60. After the inside of the liquid pipe 40 is evacuated using a vacuum pump or the like, the working fluid C is injected into the liquid pipe 40 through the inlet (not illustrated), and the inlet is sealed thereafter.

The solid phase bonding refers to a method of bonding two bonding targets together in the solid phase (or solid state) without melting the two bonding targets, by heating, softening, and further pressing the bonding targets to cause plastic deformation. Preferably, the metal layers 61 through 66 are all made of the same material, so that the mutually adjacent metal layers can be satisfactorily bonded by the solid phase bonding.

Accordingly, by employing the structure in which the pores are formed in each metal layer by partially communicating the bottomed holes in both the upper and lower surfaces of each metal layer, it is possible to form the pores having a constant size in the metal layer. For this reason, it is possible to prevent the capillary force generated by the pores from deteriorating, that is, decreasing, which would otherwise occur if the size of the pores were inconsistent. As a result, it is possible to stably obtain the effect of reducing the backflow of the vapor Cv from the evaporator 10 to the liquid pipe 40.

In addition, by employing a structure in which the adjacent bottomed holes overlap each other in their entirety at the portion where the mutually adjacent metal layers are laminated, the mutually adjacent metal layers can be made to contact each other over a large area, thereby achieving a strong bonding. For example, because the third parts 623 through 653 of the metal layers 62 through 65 overlap each other in the plan view, the third parts 623 through 653 are strongly pressed between the metal layer 61 and the metal layer 66, and the struts 81 through 83 are strongly bonded to the metal layers 61 and 66.

The porous body 60 may be provided in a portion of the condenser 20, and May be provided in a portion of the vapor pipe 30.

First Modification of First Embodiment

Figure 13:
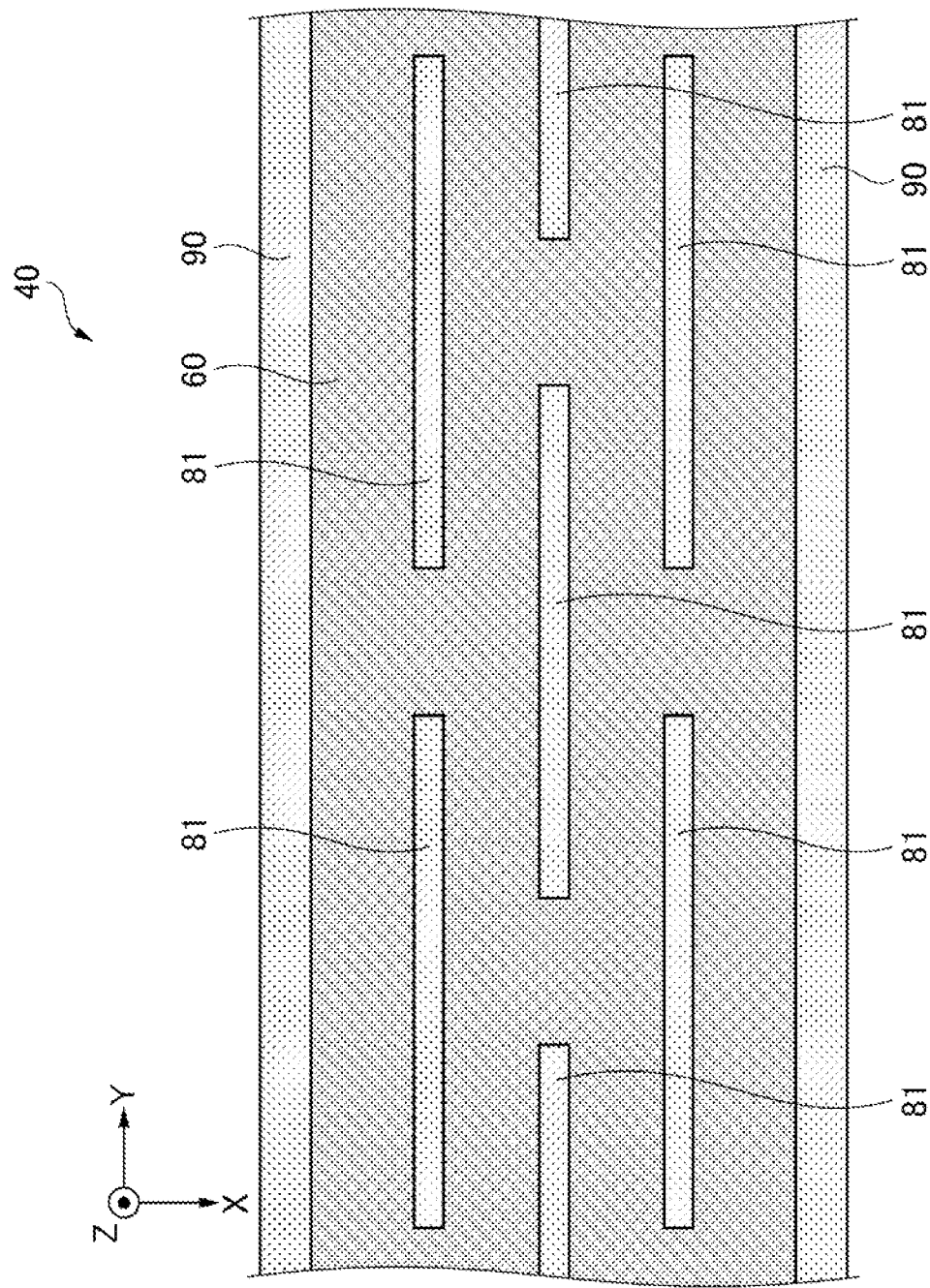
FIG. 13 is a plan view illustrating an example of the liquid pipe of the loop heat pipe according to a first modification of the first embodiment.

In a first modification of the first embodiment, the arrangement of the struts 81 is different from that of the first embodiment. In the first modification of the first embodiment, a description of the parts that are the same as those of the embodiment described above may be omitted. FIG. 13 is the plan view illustrating an example of the liquid pipe of the loop heat pipe according to the first modification of the first embodiment. FIG. 13 is the plan view of a part corresponding to the part A illustrated in FIG. 1. In FIG. 13, the illustration of the metal layer 61 is omitted, in order to illustrate the planar shapes of the porous body and the struts inside the liquid pipe 40.

In the first modification of the first embodiment, the positions of the adjacent struts 81 which are adjacent to each other along the X-direction are offset in the Y-direction, as illustrated in FIG. 13. The structure of other parts of the loop heat pipe 1 according to the first modification is similar to that of the first embodiment.

According to the first modification, it is possible to obtain effects similar to those obtainable in the first embodiment.

The struts 81 need not be provided at a plurality of positions along the Y-direction. For example, a strut 81 having the same length as the liquid pipe 40 may be provided to extend from the condenser 20 to the evaporator 10.

Second Modification of First Embodiment

Figure 14:
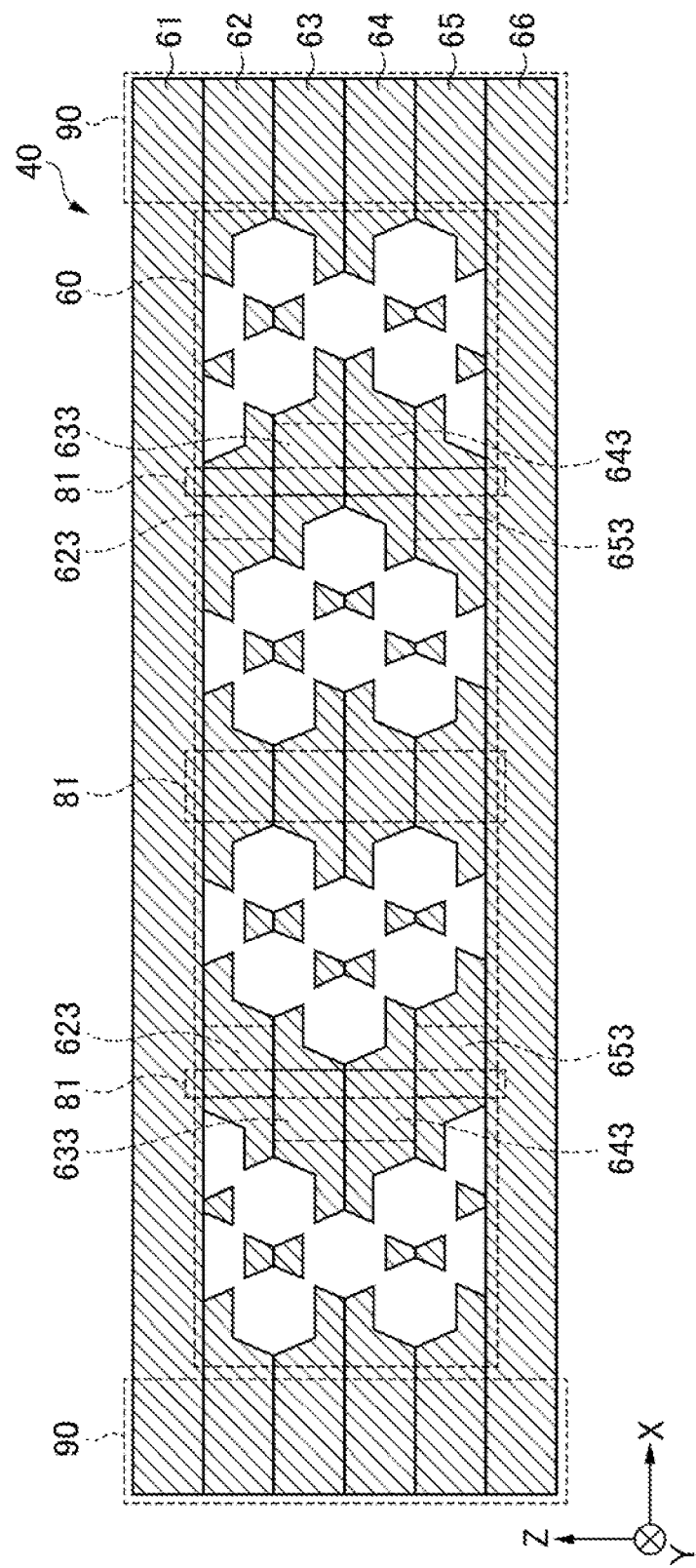
FIG. 14 is a plan view illustrating an example of the liquid pipe of the loop heat pipe according to a second modification of the first embodiment.

In a second modification of the first embodiment, the structure of the struts 81 is different from that of the first embodiment. In the second modification of the first embodiment, a description of the parts that are the same as those of the embodiment described above may be omitted. FIG. 14 is a cross sectional view illustrating an example of the liquid pipe of the loop heat pipe according to the second modification of the first embodiment. FIG. 14 corresponds to a cross sectional view along a line IV-IV in FIG. 3.

In the second modification of the first embodiment, the positions along the X-direction of the third parts 623 through 653 included in a part of the struts 81, are offset as illustrated in FIG. 14. However, in each strut 81, at least a portion of third part 623, a portion of third part 633, a portion of third part 643, and a portion of third part 653 overlap each other. In other words, each of the third parts 623, 633, 643, and 653 includes a region overlapping the other third parts in the plan view. The structure of other parts of the loop heat pipe 1 according to the second modification is similar to that of the first embodiment.

According to the second modification, it is possible to obtain effects similar to those obtainable in the first embodiment. Further, according to the second modification, it is possible to easily cope with various layouts of the porous body 60.

Third Modification of First Embodiment

Figure 15:
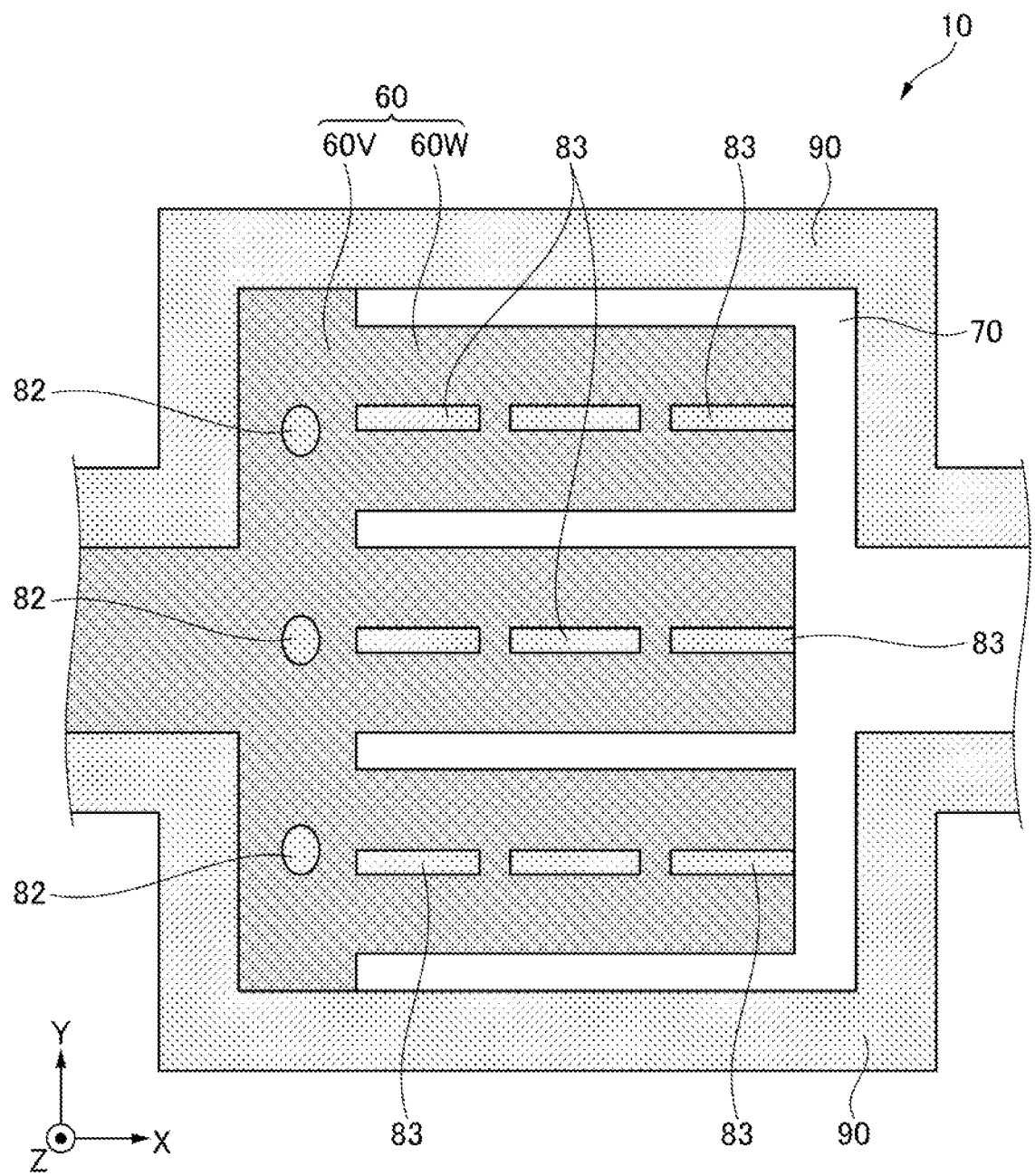
FIG. 15 is a plan view illustrating an example of the liquid pipe of the loop heat pipe according to a third modification of the first embodiment.

In a third modification of the first embodiment, the arrangement of the struts 83 is different from that of the first embodiment. In the third modification of the first embodiment, a description of the parts that are the same as those of the embodiment described above may be omitted. FIG. 15 is a diagram illustrating an example of the evaporator of the loop heat pipe according to the third modification of the first embodiment. In FIG. 15, the illustration of the metal layer 61 is omitted, in order to illustrate the planar shapes of the porous body and the struts inside the evaporator 10.

In the third modification of the first embodiment, three struts 83 are arranged side by side along the X-direction within each projecting part 60w, as illustrated in FIG. 15. The structure of other parts of the loop heat pipe 1 according to the third modification is similar to that of the first embodiment.

According to the third modification, it is possible to obtain effects similar to those obtainable in the first embodiment.

Second Embodiment

Figure 16:
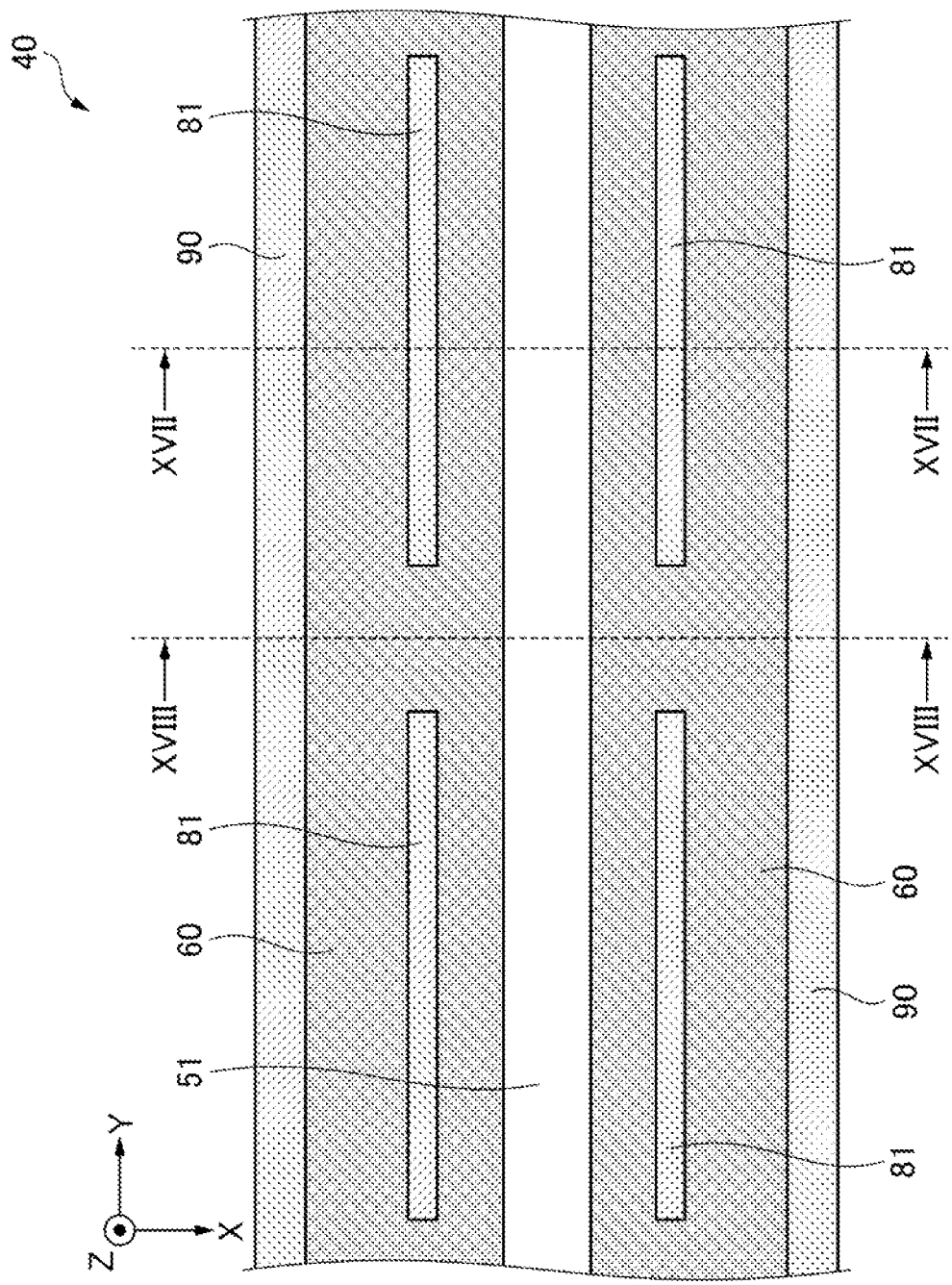
FIG. 16 is a plan view illustrating an example of the liquid pipe of the loop heat pipe according to a second embodiment.
Figure 17:
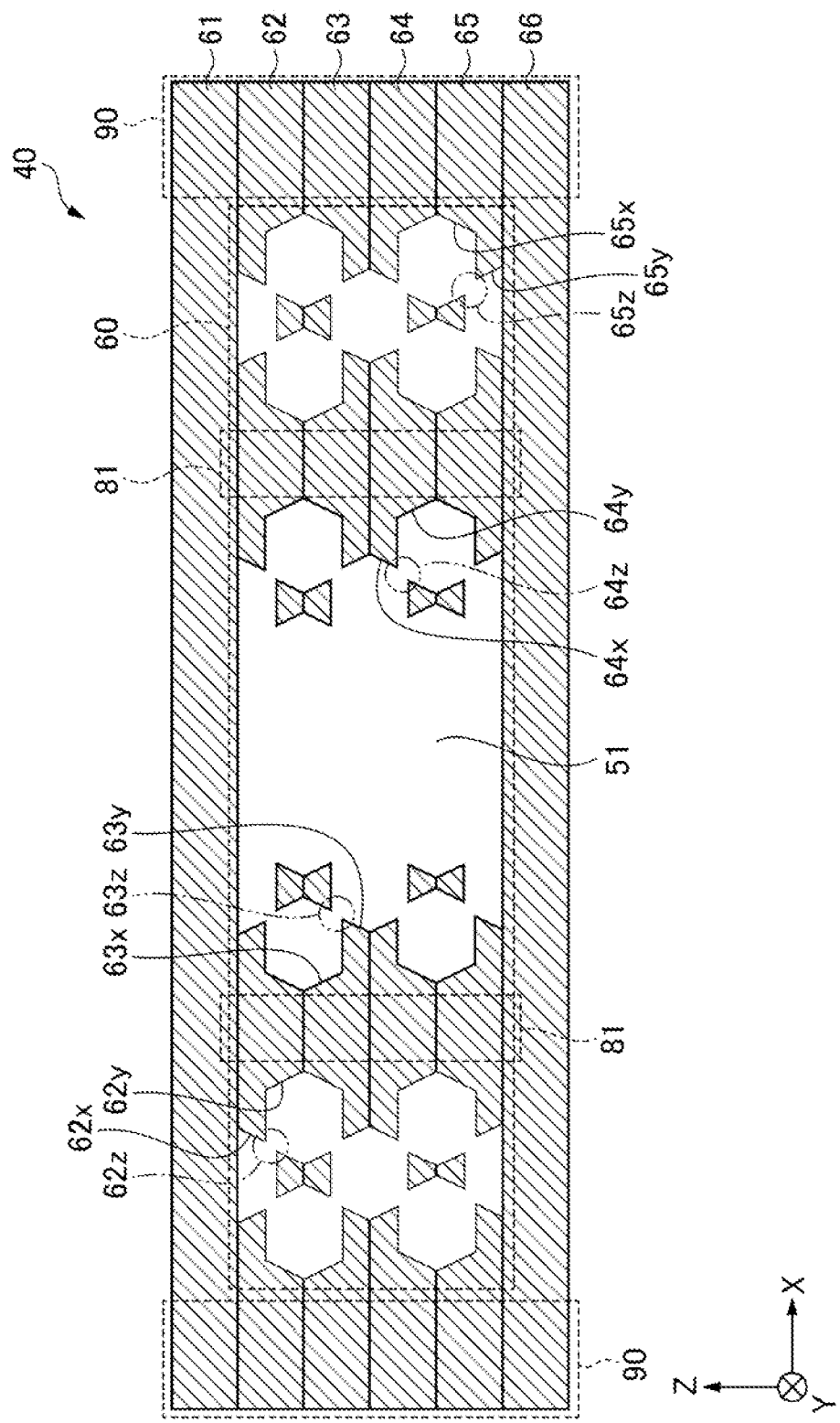
FIG. 17 is a cross sectional view (part 1) illustrating the example of the liquid pipe of the loop heat pipe according to the second embodiment.
Figure 18:
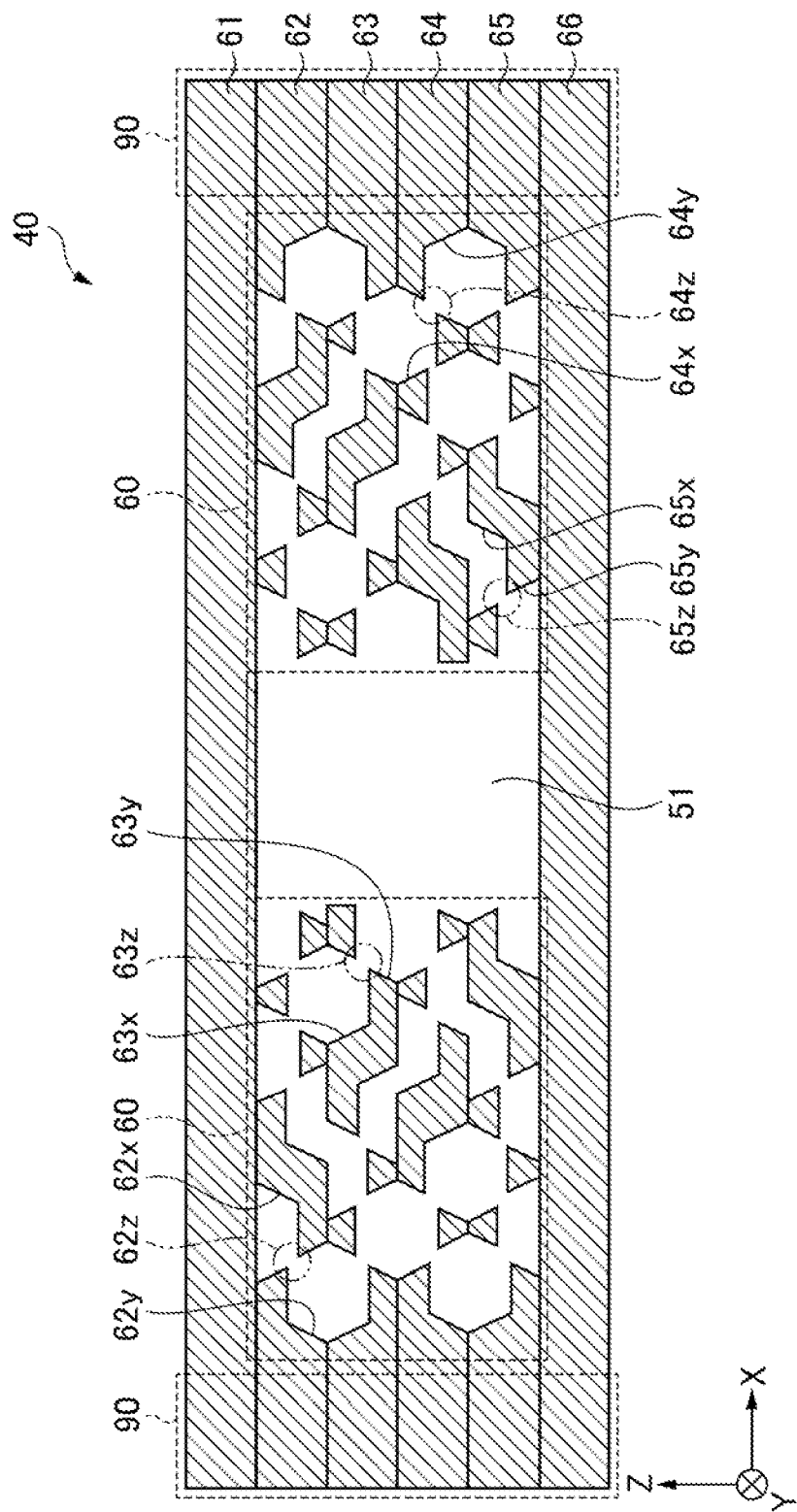
FIG. 18 is a cross sectional view (part 2) illustrating the example of the liquid pipe of the loop heat pipe according to the second embodiment.

In a second embodiment, the structure of the liquid pipe 40 is different from that of the first embodiment. In the second embodiment, a description of the parts that are the same as those of the embodiment described above may be omitted. FIG. 16 through FIG. 18 illustrate an example of the liquid pipe of the loop heat pipe according to the second embodiment. FIG. 16 is a plan view illustrating a part corresponding to the part A illustrated in FIG. 1. FIG. 17 is a cross sectional view along a line XVII-XVII in FIG. 16. FIG. 18 is a cross sectional view along a line XVIII-XVIII in FIG. 16. In FIG. 16, the illustration of the metal layer 61 is omitted, in order to illustrate the planar shapes of the porous body and the struts inside the liquid pipe 40.

In the second embodiment, the porous body 60 is provided inside the liquid pipe 40 at two locations so that the porous body 60 makes contact with the pipe walls 90 on both sides, as illustrated in FIG. 16 through FIG. 18. In other words, a pair of porous bodies 60 is provided inside the liquid pipe 40. One of the pair of porous bodies 60 is formed integrally with one wall 91, and the other of the pair of porous bodies 60 is formed integrally with the other wall 91. The struts 81 are arranged to penetrate each of the pair of porous bodies 60. Predetermined struts 81 may penetrate one of the pair of porous bodies 60, and the remaining struts 81, other than the predetermined struts 81, may penetrate the other of the pair of porous bodies 60. The predetermined struts 81 may include one or more struts 81, for example. A space 51, into which the working fluid C flows, is provided between the two porous bodies 60. The space 51 is surrounded by mutually opposing surfaces of two porous bodies 60, the lower surface of metal layer 61, and the upper surface of metal layer 66. The space 51 is part of passage 50. At least a part of the bottomed holes forming the porous body 60 communicates to the space 51. The structure of other parts of the loop heat pipe 1 according to the second embodiment is similar to that of the first embodiment.

According to the second embodiment, it is possible to obtain effects similar to those obtainable in the first embodiment. Further, the working fluid C can flow inside the space 51.

Modification of Second Embodiment

In a modification of the second embodiment, the structure of the liquid pipe 40 is different from that of the second embodiment. In the modification of the second embodiment, a description of the parts that are the same as those of the embodiments described above may be omitted. FIG. 19 is a plan view illustrating an example of the liquid pipe of the loop heat pipe according to the modification of the second embodiment. FIG. 19 is a plan view illustrating a part corresponding to the part A illustrated in FIG. 1. In FIG. 19, the illustration of the metal layer 61 is omitted, in order to illustrate the planar shapes of the porous body and the struts inside the liquid pipe 40.

In the modification of the second embodiment, the porous body 60 is provided at a position separated from the pipe walls 90 on both sides, inside the liquid pipe 40, as illustrated in FIG. 19. The space 51, into which the working fluid C flows, is formed between the porous body 60 and one pipe wall 90, and between the porous body 60 and the other pipe wall 90. The spaces 51 are surrounded by the mutually opposing surfaces of the pipe wall 90 and the porous body 60, the lower surface of metal layer 61, and the upper surface of metal layer 66. The spaces 51 are parts of passage 50. At least a part of the bottomed holes forming the porous body 60 communicates to the spaces 51. The structure of other parts of the loop heat pipe 1 according to the modification of the second embodiment is similar to that of the second embodiment.

According to the modification of the second embodiment, it is possible to obtain effects similar to those obtainable in the second embodiment.

Therefore, accordingly to each of the embodiments and modifications described above, it is possible to provide a loop heat pipe, and a method for manufacturing the loop heat pipe, which can reduce the deformation of the loop heat pipe due to changes in the volume of the working fluid.

Various aspects of the subject matter described herein may be set out non-exhaustively in the following numbered clauses:

1. A method for manufacturing a loop heat pipe which includes a pair of outermost metal layers, an intermediate metal layer provided between the pair of outermost metal layers, an evaporator configured to vaporize a working fluid to generate vapor, a condenser configured to liquefy the vapor of the working fluid, and a liquid pipe and a vapor pipe, connecting the evaporator and the condenser, and forming a loop shaped passage, the method including:
    forming the intermediate metal layer, including a pair of walls forming a part of a pipe wall of the evaporator, the condenser, the liquid pipe, and the vapor pipe, a porous body provided between the pair of walls, and a strut penetrating the porous body and bonding the pair of outermost metal layers to each other, from one or a plurality of metal layers,
    wherein the forming the intermediate metal layer etches the one or plurality of metal layers to form
        a first part forming at least a part of the pair of walls,
        a second part connected to the first part, and forming at least a part of the porous body, and
        a third part connected to the second part, and forming at least a part of the strut.
2. The method for manufacturing the loop heat pipe according to clause 1, wherein the forming the intermediate metal layer forms the strut integrally with the porous body.
3. The method for manufacturing the loop heat pipe according to clause 1, wherein the forming the intermediate metal layer forms the strut from a solid part.
4. The method for manufacturing the loop heat pipe according to any one of clauses 1 to 3, wherein the forming the intermediate metal layer forms the third part from a solid part, and bonds third parts of each of two or more metal layers to each other to form the strut.
5. The method for manufacturing the loop heat pipe according to any one of clauses 1 to 3, wherein the forming the intermediate metal layer forms the third part which includes a region overlapping other third parts in a plan view.
6. The method for manufacturing the loop heat pipe according to clause 1, wherein the forming the intermediate metal layer forms third parts at positions aligned in a plan view among two or more metal layers forming the intermediate metal layer.
7. The method for manufacturing the loop heat pipe according to any one of clauses 1 to 6, wherein the forming the intermediate metal layer forms the strut at a plurality of positions between the pair of walls.

Although the embodiments and modifications are numbered with, for example, "first," "second," or "third," the ordinal numbers do not imply priorities of the embodiments and modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A loop heat pipe comprising:
    a pair of outermost metal layers having a pair of outer surfaces on opposite sides thereof, and a pair of inner surfaces opposing each other;
    an intermediate metal layer provided between the pair of inner surfaces of the pair of outermost metal layers;
    an evaporator configured to vaporize a working fluid to generate vapor;
    a condenser configured to liquefy the vapor of the working fluid;
    a liquid pipe connecting the evaporator and the condenser; and
    a vapor pipe connecting the evaporator and the condenser, and forming a loop shaped passage together with the liquid pipe,
    wherein the intermediate metal layer includes
        a pair of walls, located at opposite ends of the intermediate metal layer along a direction parallel to the pair of outer surfaces of the pair of outermost metal layers, and forming a part of a pipe wall of the evaporator, the condenser, the liquid pipe, and the vapor pipe,
        a porous body provided between the pair of walls,
        a plurality of first struts, other than the pipe wall, penetrating the porous body at a plurality of positions in a plan view viewed in a perpendicular direction with respect to one of the pair of outer surfaces of the pair of outermost metal layers, and extending linearly in the perpendicular direction so as to bond the pair of outermost metal layers to each other, wherein the plurality of first struts, in the plan view, have a shape elongated in a primary direction of flow of the working fluid and are disposed intermittently in the primary direction of flow, so that a portion of the porous body is disposed between adjacent first struts that are mutually adjacent along the primary direction of flow, among the plurality of first struts, and
one or a plurality of metal layers,
wherein each of the one or plurality of metal layers of the intermediate metal layer includes
a first part forming at least a part of the pair of walls,
a second part connected to the first part, and forming at least a part of the porous body, and
a third part connected to the second part, and forming at least a part of the plurality of first struts.

2. The loop heat pipe as claimed in claim 1, wherein the plurality of first struts are integral with the porous body.

3. The loop heat pipe as claimed in claim 1, wherein the plurality of first struts are solid parts.

4. The loop heat pipe as claimed in claim 1, wherein
the intermediate metal layer includes a plurality of metal layers,
the third part is a solid part, and
third parts of plurality of metal layers are bonded to one another to form the plurality of first struts.

5. The loop heat pipe as claimed in claim 4, wherein the porous body includes
a first bottomed hole which caves in from a first surface of one of the plurality of metal layers, closer to one of pair of inner surfaces of the pair of outermost metal layers than to the other of the pair of inner surfaces of the pair of outermost metal layers, to an approximate center along a thickness direction of the one of the plurality of metal layers,
a second bottomed hole which caves in from a second surface of the one of the plurality of metal layers, opposite to the first surface and closer to the other of pair of inner surfaces of the pair of outermost metal layers than to the one of the pair of inner surfaces of the pair of outermost metal layers, to the approximate center along the thickness direction of the one of the plurality of metal layers, and
a pore communicating with the first bottomed hole and the second bottomed hole.

6. The loop heat pipe as claimed in claim 1, wherein the third part includes a region overlapping other third parts in the plan view.

7. The loop heat pipe as claimed in claim 1, wherein positions of the third parts in the plan view are aligned among the plurality of metal layers forming the intermediate metal layer.

8. The loop heat pipe as claimed in claim 1, wherein
the porous body includes a pair of porous bodies provided inside the liquid pipe,
a portion of the plurality of first struts penetrates one of the pair of porous bodies,
another portion of the plurality of first struts penetrates the other of the pair of porous bodies,
the one of the pair of porous bodies is integral with one of the pair of walls,
the other of the pair of porous bodies is integral with the other of the pair of walls, and
the working fluid flows into a space between the pair of porous bodies.

9. The loop heat pipe as claimed in claim 8, wherein the plurality of first struts extend along the liquid pipe.

10. The loop heat pipe as claimed in claim 1, wherein
the porous body is provided at a position separated from the pair of walls inside the liquid pipe, and
the working fluid flows into a space between one of the pair of walls and the porous body, and into a space between the other of the pair of walls and the porous body.

11. The loop heat pipe as claimed in claim 1, wherein
a portion of the porous body is provided inside the evaporator,
the portion of the porous body inside the evaporator is formed to a comb-like shape in the plan view, including a connecting part, and a plurality of projecting parts each having one end connected to the connecting part, and
the intermediate metal layer further includes
a plurality of second struts penetrating the connecting part at a plurality of positions in the plan view and bonding the pair of outermost metal layers to each other, and
a plurality of third struts penetrating the plurality of projecting parts at a plurality of positions in the plan view and bonding the pair of outermost metal layers to each other.

12. The loop heat pipe as claimed in claim 11, wherein the plurality of second struts and the plurality of third struts are other than the pipe wall.

13. The loop heat pipe as claimed in claim 11, wherein the plurality of first struts and the plurality of third struts have a shape elongated in the primary direction of flow of the working fluid from the liquid pipe toward the vapor pipe in the plan view.

14. The loop heat pipe as claimed in claim 13, wherein the plurality of second struts have an elliptical shape with a major axis direction perpendicular to the primary direction of flow of the working fluid from the liquid pipe toward the vapor pipe in the plan view.

15. The loop heat pipe as claimed in claim 1, wherein the plurality of first struts have a shape elongated in the primary direction of flow of the working fluid from the liquid pipe toward the vapor pipe in the plan view.

16. The loop heat pipe as claimed in claim 1, wherein the porous body includes
a first bottomed hole which caves in from a first surface of the intermediate metal layer, closer to one of pair of inner surfaces of the pair of outermost metal layers than to the other of the pair of inner surfaces of the pair of outermost metal layers, to an approximate center along a thickness direction of the intermediate metal layer,
a second bottomed hole which caves in from a second surface of the intermediate metal layer, opposite to the first surface and closer to the other of pair of inner surfaces of the pair of outermost metal layers than to the one of the pair of inner surfaces of the pair of outermost metal layers, to the approximate center along the thickness direction of the intermediate metal layer, and
a pore communicating with the first bottomed hole and the second bottomed hole.

\* \* \* \* \*